United States Patent [19]
Burns

[11] Patent Number: 5,279,029
[45] Date of Patent: Jan. 18, 1994

[54] ULTRA HIGH DENSITY INTEGRATED CIRCUIT PACKAGES METHOD

[75] Inventor: Carmen D. Burns, Austin, Tex.

[73] Assignee: Staktek Corporation, Austin, Tex.

[21] Appl. No.: 59,401

[22] Filed: May 11, 1993

Related U.S. Application Data

[62] Division of Ser. No. 561,417, Aug. 1, 1990.

[51] Int. Cl.$^5$ .......................................... H01R 43/00
[52] U.S. Cl. ........................................ 29/856; 29/830; 264/102; 437/205; 437/209
[58] Field of Search ............... 29/830, 825, 854, 855, 29/856; 264/102; 437/209; 361/386

[56] References Cited

U.S. PATENT DOCUMENTS

| | | | |
|---|---|---|---|
| 3,713,893 | 1/1973 | Shirland | 437/205 X |
| 4,241,493 | 12/1980 | Andrulitis et al. | 437/209 X |
| 4,321,418 | 3/1982 | Dran et al. | 264/102 X |
| 4,733,461 | 3/1988 | Nakano | 29/830 |

OTHER PUBLICATIONS

Information allegedly written by Emory Garth regarding "Memory Stacks," Applicant received a fasimile from Emory Garth on Jan. 26, 1993, Applicant does not know when this information was written or its validity. Catalog of Dense-Pac Microsystems, Inc. describing two products: DPS512X16A3 Ceramic 512K X 16 CMOS SRAM MODULE and DPS512X16AA3 High Speed Ceramic 512K X 16 CMOS SRAM MODULE, pp. 865-870.

Primary Examiner—Carl J. Arbes
Attorney, Agent, or Firm—Fulbright & Jaworski

[57] ABSTRACT

An ultra-thin level-one integrated circuit package with improved moisture penetration characteristics manufactured using a transfer molded casing with metallic lamination layers is provided. Additionally, a method and apparatus for providing a multiple-element modular package including a plurality of such level-one packages in horizontal or vertical stack configuration is provided.

24 Claims, 15 Drawing Sheets

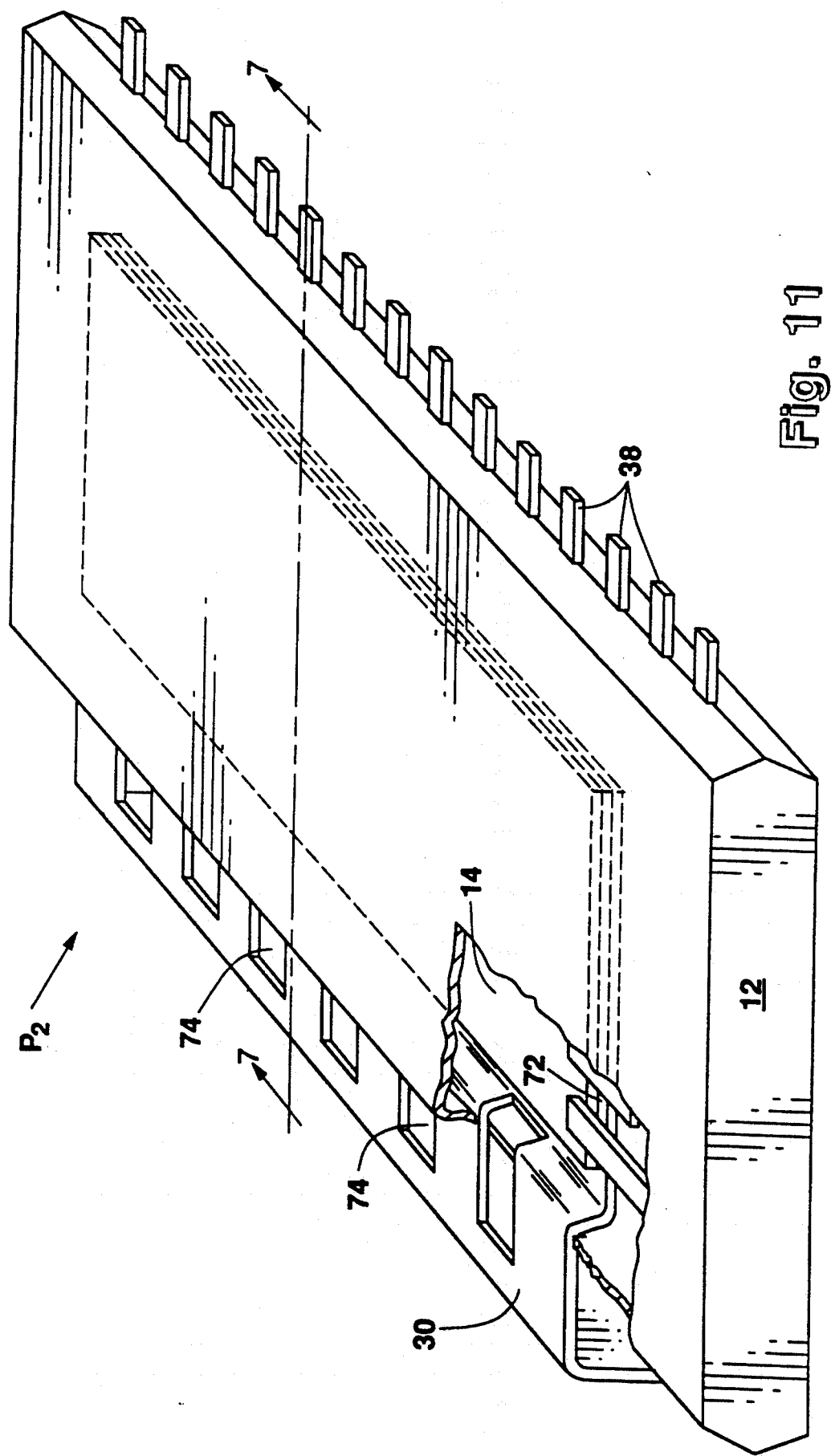

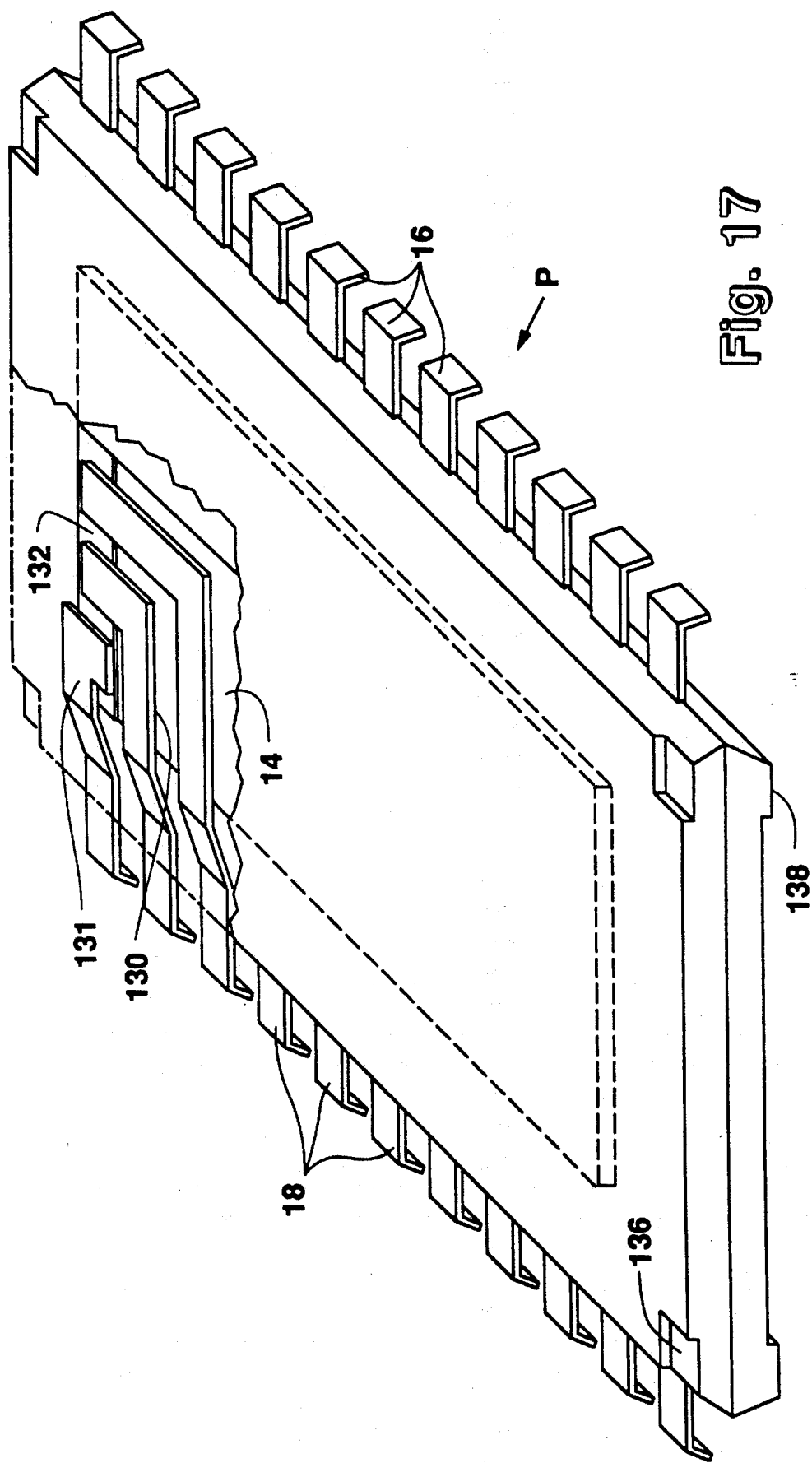

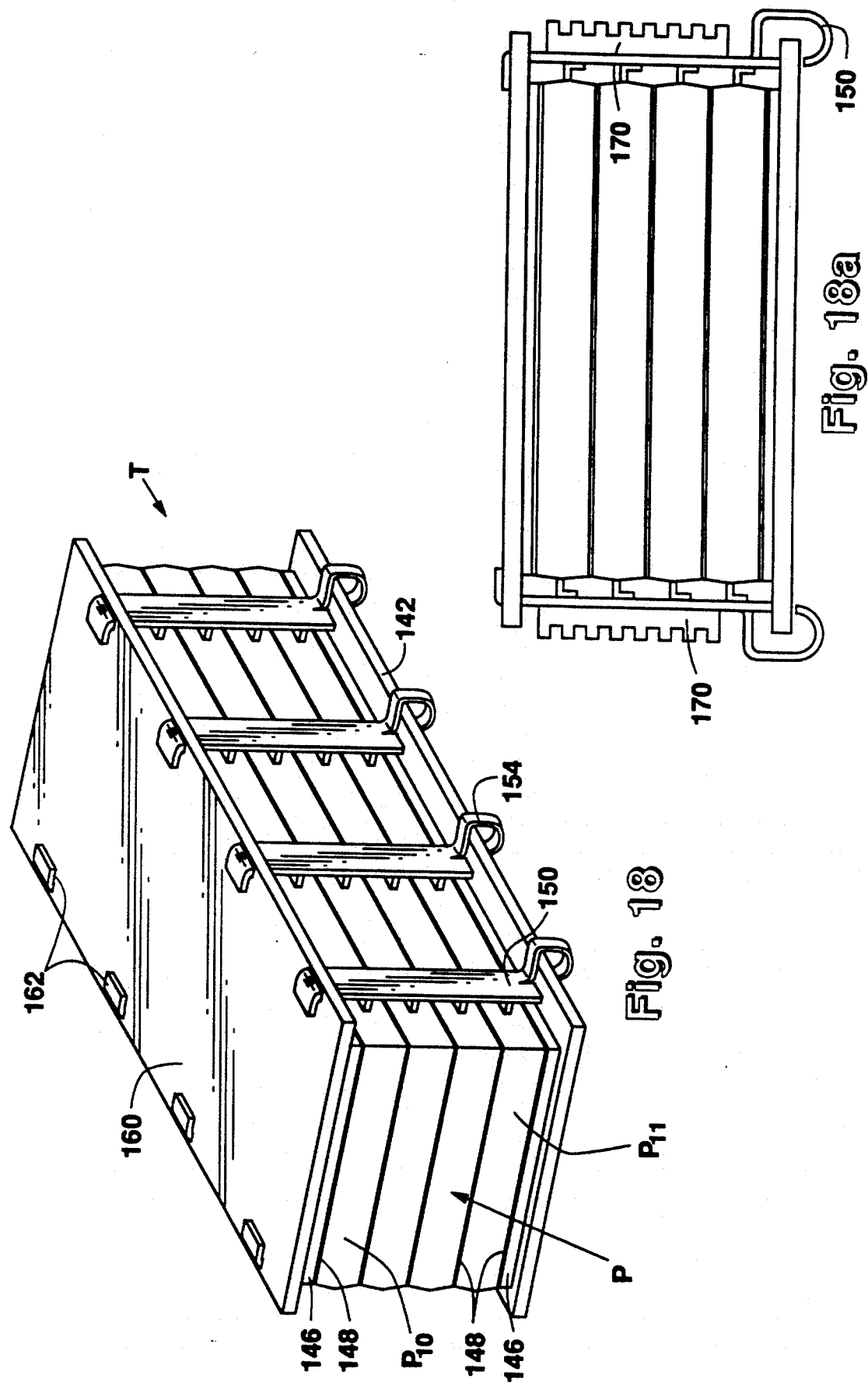

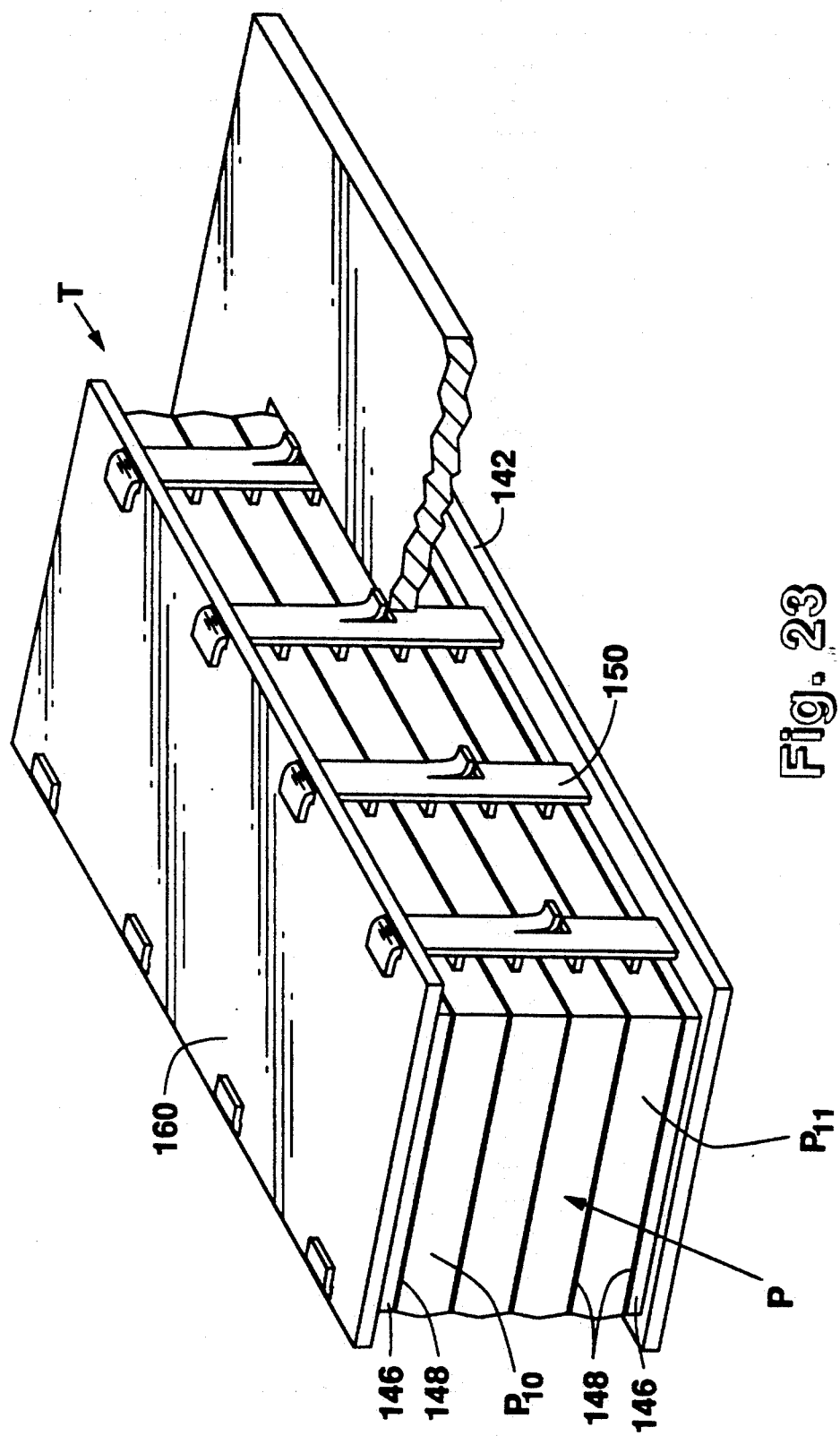

ULTRA HIGH DENSITY INTEGRATED CIRCUIT PACKAGES METHOD

This is a divisional of application Ser. No. 07/561,417, filed Aug. 1, 1990.

BACKGROUND OF THE INVENTION

1. Field of Invention

This invention relates to a method and apparatus for achieving ultra high density integrated circuit packages incorporating a plurality of ultra-thin molded integrated circuit packages stacked and interconnected into an ultra-high density three-dimensional module.

2. Discussion of the Related Art

Packaging techniques for integrated circuits have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package these circuits in space efficient, yet reliable and mass producible packages.

The introduction of highly sophisticated integrated circuit microprocessors led to the rapid development of complex personal computers and other common bus systems utilizing a variety of integrated circuit elements such as memory devices (DRAMS, SRAMS), programmable logic arrays (PLAs), microprocessors (CPUs), coprocessors, and other related integrated circuit elements which had to be assembled, mounted and interconnected into as compact, yet reliable packages as feasible to satisfy the industry demands for miniaturization.

Other key considerations in developing packaging for such circuits have been the cost of manufacture, the reliability of the packaged device, heat transfer, moisture penetration, standardization of mounting and interconnect methods, and the ability to test and control the quality of the packaged devices.

In the past, one area of concentration for high density packaging has been memory devices such as SRAMS and DRAMS. Prior systems typically utilized a transfer molded plastic encasement surrounding the integrated circuit and having one of a variety of pin out or mounting and interconnect schemes. The older M-DIP (Dual-In-Line-Plastic) provides a relatively flat, molded package having dual parallel rows of leads extending from the bottom for through-hole connection and mounting to an underlying printed circuit board. These packages provided 100 mil spacing between leads.

A more dense package was the 100-mil SIP (Single-In-Line-Plastic) which was assembled on edge with two rows of 100-mil staggered leads extending from the bottom edge for through hole assembly. Another popular prior art package is the PLCC (Plastic Leaded Chip Carrier) SOJ (Small Outline J-leaded) molded package with twenty surface-mount designed J-leads (length 0.67", width 0.34", height 0.14"). This prior art package is illustrated schematically in FIG. 1 and shown at approximate actual size in FIG. 2.

In order to obtain more density and provide lower cost socketability (i.e. removable mounting) and to allow for after-market sale of additional memory units the SIMM (Single-In-Line Memory Module) was developed. This package is schematically illustrated in FIG. 3. In this package typically nine one megabyte or four-megabyte DRAMS are surface mounted into a socket which is in turn edge-mounted on a large printed circuit board containing additional sockets or components. While this design provided some increase in density, it had the drawback of providing a module extending from one-half to nearly two inches vertically above the printed circuit board.

Newer, higher density versions of the SIMM design with even small versions of the DRAM plastic package have been developed. These thinner versions of SOJ DRAMS are one half the thickness (having a plastic packaging thickness of about 70 mils) of standard SOJ designs, and have been mounted on both sides of printed circuit boards. Even smaller TSOP packages have been developed experimentally with a plastic thickness of one millimeter and lower profile gull-wing leads for surface mounting. FIGS. 1-3 illustrate typical embodiments of some of these prior art packages. Based on experience with those prior art designs, for reasons of reliability related to moisture penetration and mechanical integrity the industry has adopted a standard thickness for plastic packaging of approximately one millimeter (40 mils), or approximately 10.5 mils on each side of a 19 mil thick integrated circuit element.

In contrast to such prior art systems, the packaging method of the present invention provides a reliable, cost efficient, easily manufacturable package with a plurality of ultra-thin level-one package elements assembled in an integrated module or level-two package which can be mounted to a printed circuit board directly or via an underlying socket or header.

SUMMARY OF THE INVENTION

The present invention provides a level-one packaging method which enables the level-one elements to be packaged in transfer molded casing approximately 7 mils or less thick, encompassing an integrated circuit die element approximately eight to sixteen mils thick to produce a reliable level-one package less than thirty-two mils thick. These level-one units are then bound together mechanically or using an epoxy adhesive approximately one mil thick, with the outer surfaces of the outside level-one units having a thin metal foil adhered thereto or deposited using known semiconductor manufacturing methods such as vacuum deposition, sputtering or the like.

This packaging technique provides a high density module or level-two package with improved moisture resistance, and the lamination of multiple level-one elements together provides adequate structural rigidity to prevent intolerable flexing of the internal integrated circuit elements. Using the packaging technique of the present invention ultra dense reliable packages such as the nine megabyte DRAM shown at approximate actual size in FIG. 4 can be achieved.

In one form of a preferred embodiment, the level-one elements are configured with a single row of leads in either gull-wing or J-lead form for circuit board mounting and interconnect extending from one edge only, and having a heat sink conductive element which comprises a 2 oz. copper foil substrate in full surface contact with the internal integrated circuit die extending from the edge opposite the leads. The level-one elements are laminated together in a vertical array contained within a mounting package which includes metal side plates and a top heat sink element. The vertically extending metal side plates are provided with mounting tangs for attachment to a printed circuit board. Alternatively the level-one units can be laminated together at nn angle to reduce overall height. Furthermore, the package can be mounted to a rail header which in turn is mounted to the printed circuit board with J-leads or gull-wing leads for surface mounting. This latter embodiment provides visible solder connections for inspection.

A horizontally stacked module is also provided as an alternative form of the preferred embodiment, which utilizes similar level-one packages laminated together in a horizontal, module or level-two package. In this embodiment electrical interconnection and thermal conduction are provided by an array of vertically oriented conductive rails aligned with the vertical columns of leads, and extending from the top to the bottom of the stack. These rails can be configured with SMT gull-wing leads or J-leads for the package. Significant advantages are realized by incorporating an electrical signal bus and integral heat sink in the vertical rails which also provide structural integrity for the horizontal module. In all embodiments provision can be made for decoupling capacitors, control circuitry, self-contained power supplies as elements in the stack and configured with external heat sinking.

The computer systems of today and tomorrow are being designed with ever increasing clock rates. With the clock rates of personal computers approaching 50 MH$_2$, a single cycle memory access must be accomplished in 20 nano seconds (ns). If a static ram in a cache memory application has a 15 ns access time capability, only 5 ns is left to accommodate any gate and/or propagation delays to meet a single cycle memory access. A fast memory driver chip typically has a 3 ns gate delay, leaving 2 ns overhead. In a standard memory array assembled two dimensionally across an FR-4 type printed circuit board (PCB), the propagation delay could be larger than 2 ns and force a two cycle, 40 ns access, thus greatly affecting the overall system performance. The three dimensional modular approach described herein provides for significantly shorter, lower impedance and reactance, routing paths to the memory arrays, and the potential to support a single-cycle access.

A unique feature of the horizontally oriented level-two module or package is the relatively large cross-sectional area of the rails connecting the leads of the level-one packages. These rails act as excellent low impedance buses for both electrical current flow and thermal heat transfer. The low electrical impedance provides for less ground bounce, less signal distortion, and improved signal integrity. The low thermal resistance allows for improved heat transfer from the die interior, which provides increased reliability and longer operating life for some embodiments, and in ultra high density embodiments provides a package that can be adequately heat compensated with conventional convection techniques.

BRIEF DESCRIPTION OF THE DRAWINGS

FIG. 11 is an isometric illustration of a vertically oriented level-one package according to the present invention;

FIG. 17 is an isometric illustration with a partial cut-out view of a horizontally oriented level-one package according to the present invention;

FIG. 18 is an isometric view of a horizontally oriented modular level-two package according to the present invention;

FIG. 18a is an alternative view of the embodiment illustrated in FIG. 18;

FIG. 23 is an isometric view of a alternative embodiment of a level-two package according to the present invention adapted for mounting within an orifice formed in a printed circuit board.

DETAILED DESCRIPTION OF THE PREFERRED EMBODIMENT

Figure 1:
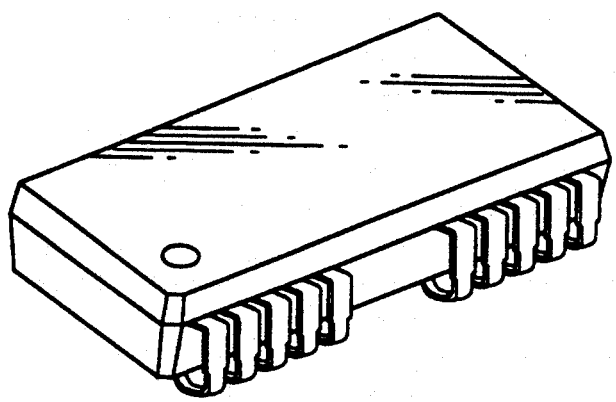
FIGS. 1-3 illustrate prior art packaging for integrated circuits.
Figure 2:
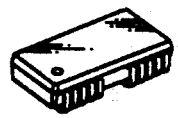
Figure 3:
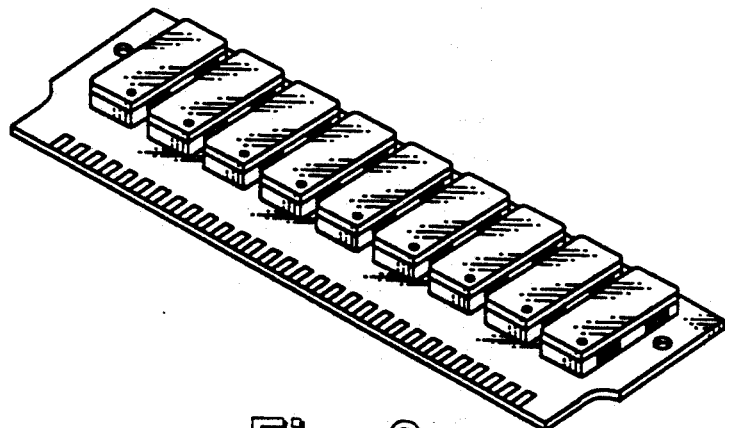
Figure 4:
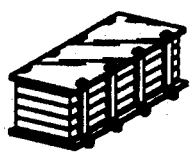
FIG. 4 is a schematic illustration of a modular package of the present invention shown at approximate actual size.
Figure 5:
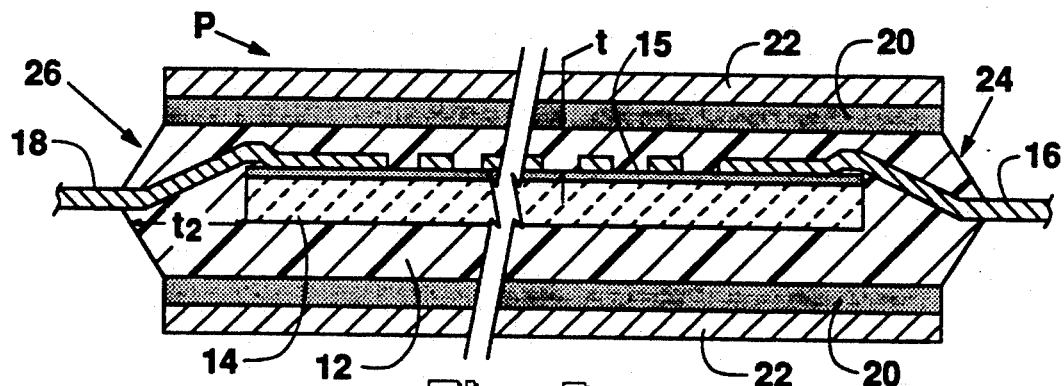
FIG. 5 illustrates the level-one design of the present invention in schematic cross-section.

A better understanding of the present invention can be had when the following detailed description is read with reference to the drawings wherein common elements are designated with like numbers or letters. Referring now to FIG. 5, a typical level-one package P is illustrated in cross-section. Package P comprises a transfer molded casing 12 surrounding the integrated circuit die 14, which is provided with an array of leads 16 and 18 for circuit interconnection. The level-one package P is formed using conventional, proven manufacturing techniques such as transfer molding and automated tape bonding, or low-profile ribbon or wire bonding to a lead frame, yet achieves substantial reduction in thickness without sacrificing circuit integrity.

Package P includes a silicon integrated circuit die element 14 having a nominal thickness of from about eight to about sixteen mils. Die 14 is provided with an array of conductive leads 16 and 18 for circuit interconnect which are attached to die 14 in the manner described above. Leads 16, 18 are laid over a semiconductor grade epoxy insulating layer 15 which covers die 14 in a conventional manner. It should also be noted that in some of the drawings leads 16, 18 are illustrated as being connected at or near the edge of die 14 for clarity, whereas in automated bonding the connection pattern is more complex. It should be noted that the present invention is not limited to embodiments having leads exiting at two sides and can be readily fabricated to accommodate single or four sided lead configuration, in either J-lead, gull-wing or other surface mount technology (SMT) lead configurations.

Die 14 is encased in a transfer molded case 12 which may be formed of any suitable commercially available high-temperature semiconductor grade thermosetting plastic such as a filled NOVOLAC material. The casing material should be selected for high temperature, tolerance, moisture control, mechanical rigidity, and chemical and thermal compatibility with the silicon die 14. In the preferred embodiment, casing 12 is made of a semiconductor grade, low stress, filled, transfer molding compound including a NOVOLAC-type epoxy.

For reasons explained below, case 12 is formed so as to have a thickness t of approximately five to seven mils. In one embodiment, after case 12 is formed, a layer of moisture resistant, high glass transition temperature epoxy 20 is applied over the upper and lower surfaces of case 12. Epoxy 20 should be selected to be suitable for curing at approximately 150° C. and endure 250° C. in subsequent manufacturing steps without reflowing. Epoxy layer 20 is applied in a thickness of one-half to one mil, and is preferably applied in a preformed film or B-stage form. A suitable epoxy is an acrylic NOVOLAC-type epoxy with plasticizers.

After the application of the epoxy layer 20, the package P is provided with an outer metal foil layer 22 applied over the B-stage epoxy 20. Alternatively, the epoxy layer 20 can be applied to foil 22 and both layers applied to the casing at once. Foil 22 can be aluminum or copper or other suitable metallic foils approximately one-half to one mil thick. The completed level-one package P is therefore approximately forty-five percent to eighty percent of the thickness of prior art packages. In the package of the present invention, the epoxy and foil laminations prevent moisture penetration, and in some applications provide sufficient structural rigidity so as to allow construction of an ultra-thin package while still preventing undesirable flexing of the die 14. Protection against moisture penetration is achieved because moisture can only penetrate from lead edges 24 and 26 and the distance $t_2$ from edges 24 and 26 to die 14 is greater than twenty-five mils.

Figure 6:
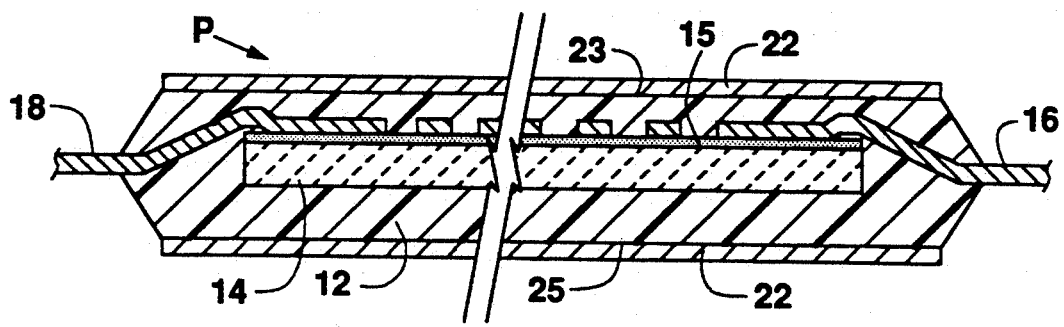
FIG. 6 illustrates an alternative embodiment of the level-one package of the present invention in schematic cross-section.

Referring now to FIG. 6, an alternative embodiment of a level-one package P is schematically illustrated in cross-section. In this embodiment, package P includes a die 14 surrounded by a transfer molded casing 12 of the type previously described. Leads 16 and 18 are tape or ribbon bonded to die 14 in the conventional manner. This embodiment does not include an epoxy layer 20 as in the previous embodiment, but instead only includes a thin (one-half to ten microns thick) metal foil lamination 22 formed of aluminum or copper foil adhered, vacuum deposited, or otherwise applied on surfaces 23 and 25 of casing 12.

Figure 7:
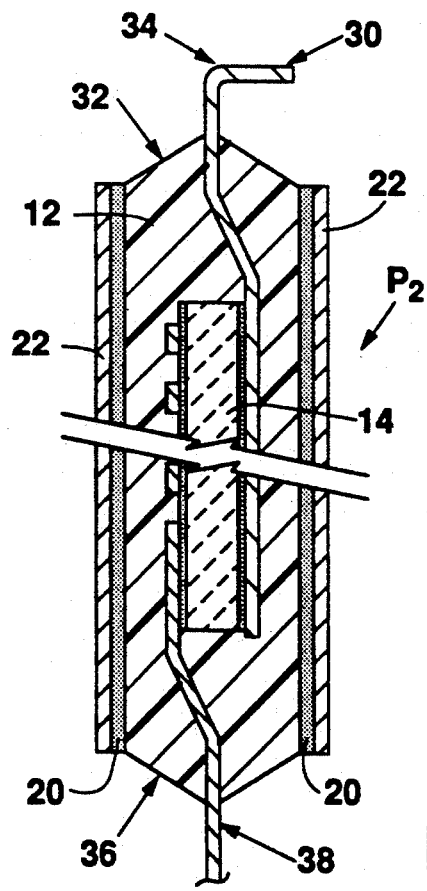
FIG. 7 illustrates a vertically oriented embodiment of a level-one package according to the present invention in schematic cross-section.

Referring now to FIG. 7, a vertical stack embodiment of a level-one package $P_2$ is illustrated in schematic cross-section. Embodiment $P_2$ is configured to have an integral full-surface contact conductive heat sink element 30 mounted to one surface of die 14. Element 30 is formed of aluminum or copper 1.4 mil to 2.8 mil thick which is surface-mounted to die 14 using a semiconductor grade, metal-filled heat conductive epoxy layer 15. Element 30 extends from one end 32 of package $P_2$ and is bent to form a heat sink end 34 shaped to dissipate heat by convection or to be attached to a larger heat sink element (not shown). It should be noted that end 34 of heat sink 30, as well as other lead type extensions from the level-one packages should be formed of flexible material and extend far enough from the package to avoid unduly stressing the package or the die connection when the package is mounted to external electrical or mechanical supports. Extension of seven to eight mils in addition to any connection length required is sufficient for these purposes. In this embodiment all leads 38 extend from edge 36 of package $P_2$. While in FIG. 7 package $P_2$ includes a transfer molded casing 12, an epoxy lamination layer 20 and foil lamination layers 22 as in the previous embodiment shown in FIG. 5, this integral heat sink embodiment could be just as readily formed without epoxy layer 20 as illustrated in FIG. 6.

Figure 8:
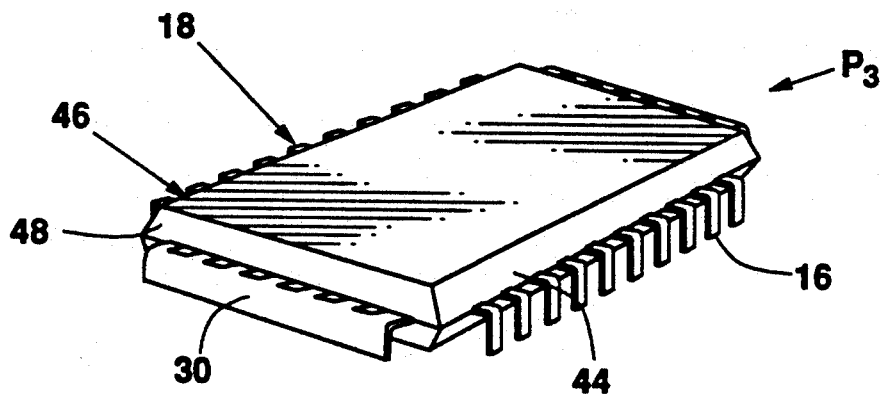
FIG. 8 illustrates a horizontal stack embodiment of a level-one package of the present invention having an integral heat sink.

Referring now to FIG. 8, a horizontal stack embodiment $P_3$ is illustrated in schematic isometric form. In this embodiment, leads 16 and 18 extend from sides 44 and 46 and are attached to die 14 (not shown) in the manner described above. Heat sink element 30 is surfaced mounted to die 14 in the manner described above with reference to FIG. 7, and brought out of end 48 of package $P_3$ for independent heat dissipation or for attachment to a larger heat sink element. Alternatively, in either the vertical embodiment $P_2$ or horizontal embodiment $P_3$ heat transfer can be achieved without element 30. In these embodiments, heat is transferred from die 14 through casing 12, epoxy layer 20 and foil layer 22 (Figs. 5 and 6).

Figure 9:
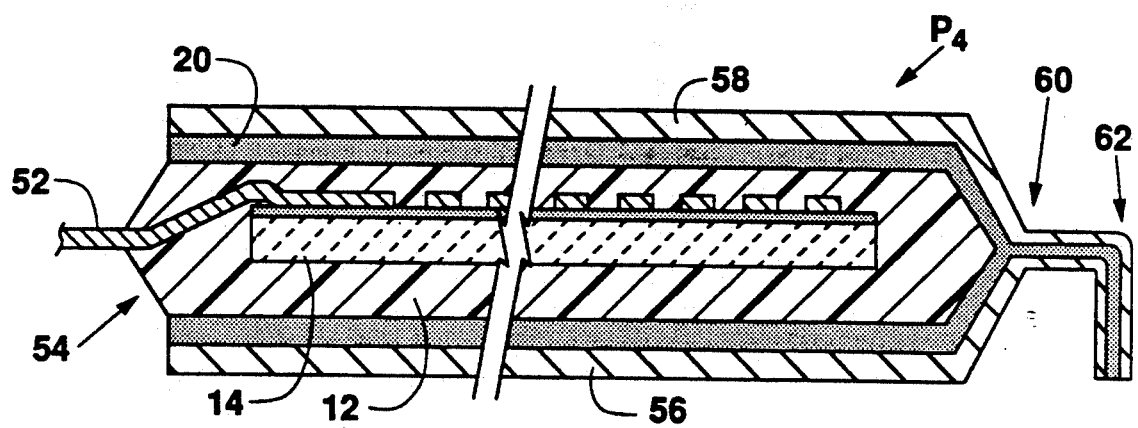
FIG. 9 illustrates in schematic cross-section an alternate vertical embodiment of a level-one package according to the present invention.

Yet another alternative, level-one embodiment is illustrated in FIG. 9. In this embodiment (shown in vertical stack configuration) all circuit leads 52 extend from end 54 of package $P_4$. Package $P_4$ includes casing 12, die 14, and optional epoxy layer 20 as in previous embodiments. In package $P_4$, foil layers 56 and 58 wrap around end 60 of package $P_4$ and are joined together to form a heat sink element similar to element 30 of FIG. 7. Foil layers 56 and 58 are epoxy bonded to package $P_4$ and to each other at end 62 using a one-half mil epoxy layer of the type previously described.

Figure 10:
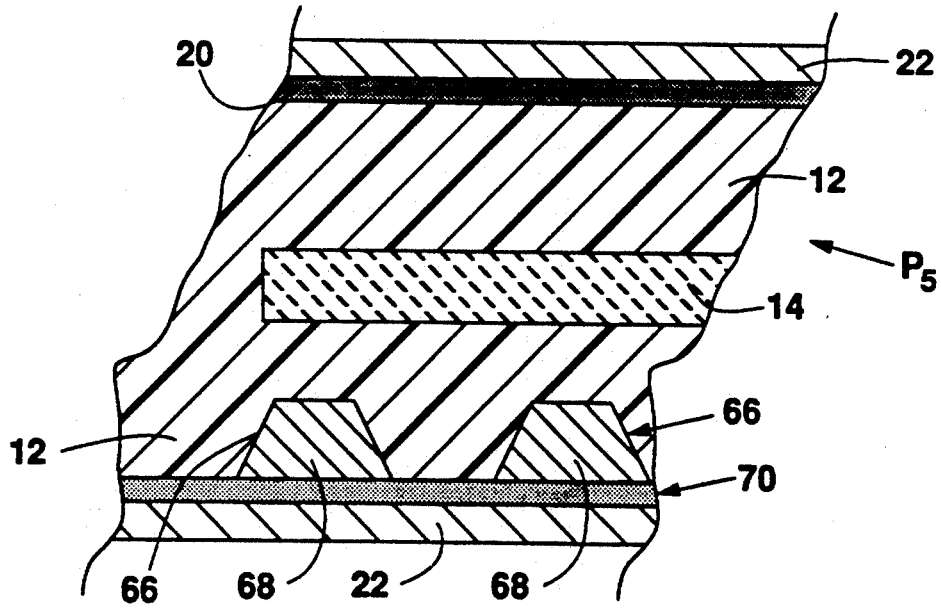
FIG. 10 illustrates in partial cross-section an alternative embodiment of a level-one package according to the present invention which includes integral heat transfer elements formed in the package casing.

Further improvement in heat transfer from die 14 can be achieved in the manner illustrated in FIG. 10. In this embodiment, package $P_5$ includes a die 14, case 12, optional epoxy upper layer 20 and foil layers 22 as previously described. To achieve greater heat transfer from die 14, cavities 66 are formed in case 12 and filled with thermally conductive epoxy material 68. Below that, an epoxy adhesive layer 70 is formed about one-half mil thick to which foil layer 22 is adhered. This enhanced heat transfer embodiment may be incorporated into any of the previously described embodiments.

Referring now to FIG. 11, the preferred level-one vertical stack embodiment of package $P_2$ (Fig. 7) is shown in schematic isometric form with partial cutaway views. In this drawing, heat sink element 30 is formed as a conductive sheet, surface mounted to die 14 via a layer of metal-filled, semiconductor grade heat transfer epoxy 72. Element 30 is formed having a plurality of slots 74 cut from element 30 prior to fabrication of package $P_2$. While not shown in precise scale, slots 74 are formed so as to relieve stress in transfer molding casing 12. In this manner, casing 12 is formed around leads 38 and through slots 74 of heat sink element 30.

LEVEL TWO PACKAGING

Another aspect of the present invention relates to the manner in which level-one packages, in either vertical or horizontal configuration can be assembled into a multi-element, modular level-two package or stack for mounting to an underlying printed circuit board.

Figure 12A:
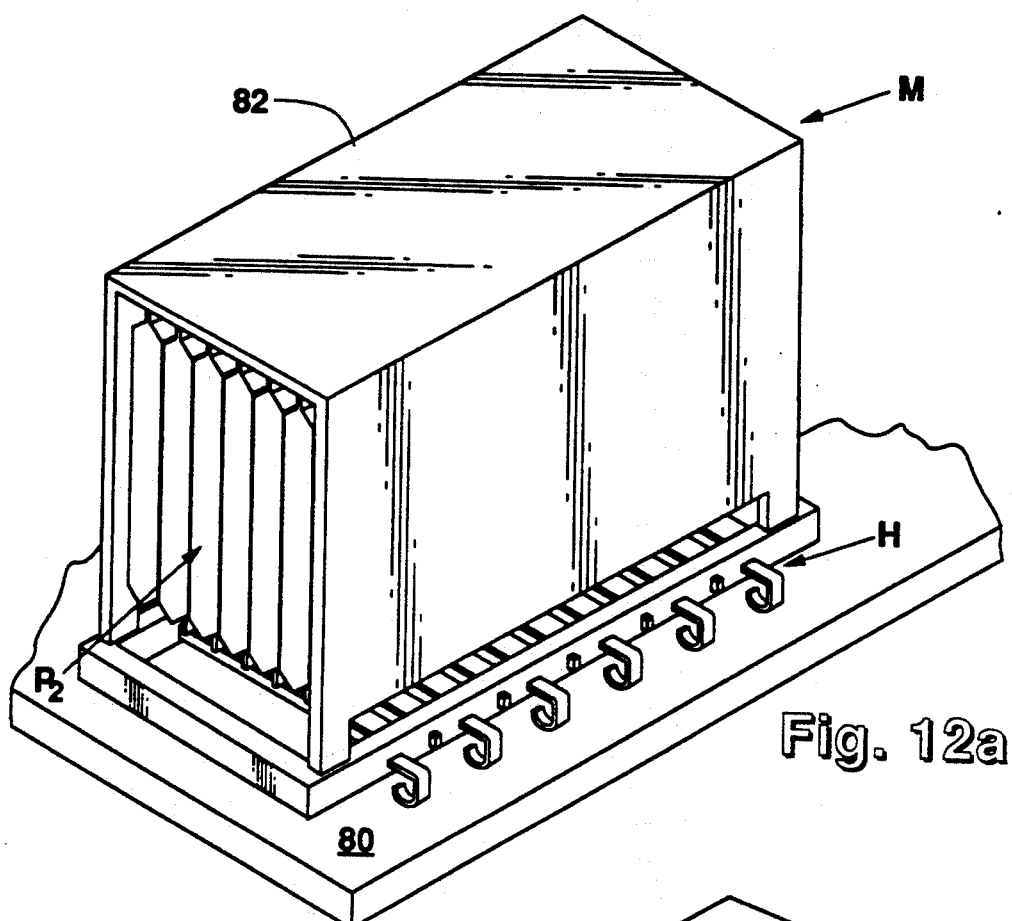
FIGS. 12a, b illustrate vertically oriented modular level-two packages according to the present invention.
Figure 12B:
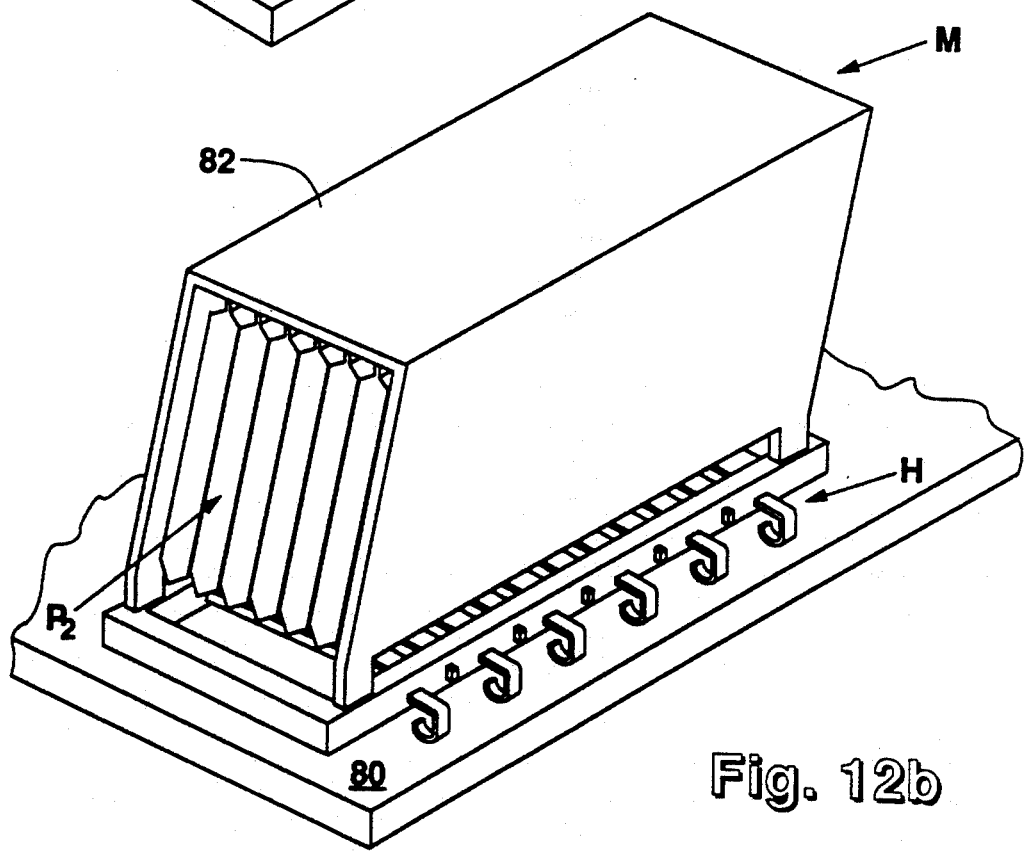

Referring now to FIG. 12, various vertical stack embodiments are schematically illustrated. In FIG. 12a, a level-two package M is formed of a plurality of vertically oriented level-one packages $P_2$ and mounted to an underlying printed circuit board 80. The details of the assembly and mounting of package M are described below. An alternate embodiment which reduces the overall height of package M is illustrated in FIG. 12b. In this embodiment, package M and the constituent level-one packages $P_2$ are inclined at an angle to reduce overall package height. In both of these embodiments, package M includes a metal or otherwise heat conductive and electrically insulated outer casing 82 formed of a continuous sheet of metal approximately six mils thick.

Figure 13:
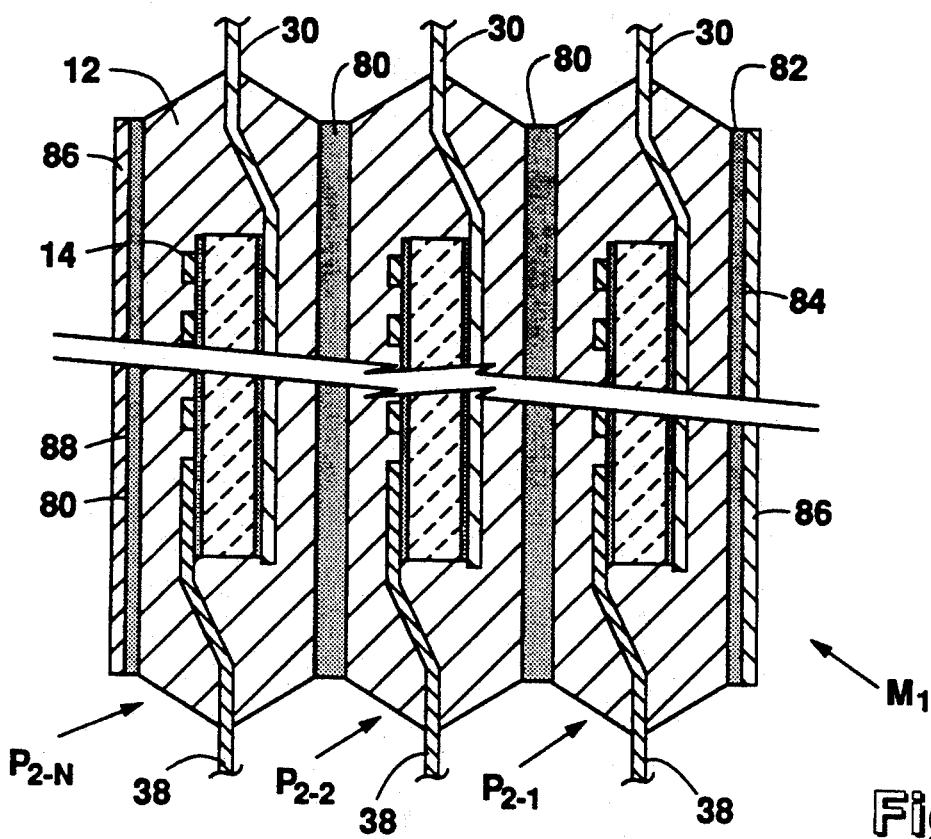
FIG. 13 illustrates an alternative vertically oriented embodiment of a portion of a modular or level-two package according to the present invention.

Referring now to FIG. 13, an alternate embodiment of a portion of a vertical stack assembly of package M is illustrated. A plurality of level-one packages $P_2$ are assembled by applying epoxy bond 80 between each element $P_2$. It should be noted that while only three elements $P_2$ are illustrated for clarity, a typical package M would include eight or nine level-one elements $P_2$. Each element $P_2$ includes a die 14, a case 12, lead elements 38 and heat sink elements 30 as previously described.

In this embodiment, each element $P_2$ is individually manufactured and tested without applying exterior epoxy layer 20 or foil layer 22 (Fig. 7). Thereafter, on a first element $P_{2-1}$ (FIG. 13) an epoxy layer 82, similar to layer 20 described above, is applied to one surface of a conductive foil layer 86, and the combined lamination of layers 82 and 86 is adhered to surface 84. After testing element $P_{2-1}$, a second layer of epoxy 80 is applied to the second, opposite side of element $P_{2-1}$, and a second level-one package $P_{2-2}$ is attached to package $P_{2-1}$. Thereafter, the combined element formed of packages $P_{2-1}$ and $P_{2-2}$ is tested. Further elements $P_{2-3}$, through $P_{2-7}$, for example, are similarly assembled. The last element $P_{2-N}$ is adhered to the preceding element in the same manner. An epoxy layer 80 and a conductive foil layer 86 is then applied to the outside surface 88 of the last element $P_{2-N}$ to complete the assembly. The assembled level-two unit $M_1$ (Fig. 13) thereby includes a number of level-one elements bonded together in laminated fashion, having conductive foil layers applied to the exterior flat surfaces of the outside elements in the stack. This lamination provides improved resistance to moisture penetration and enhances the structural rigidity of the package as a whole enabling thinner individual circuit elements $P_2$ to be used without sacrificing circuit integrity.

Figure 14:
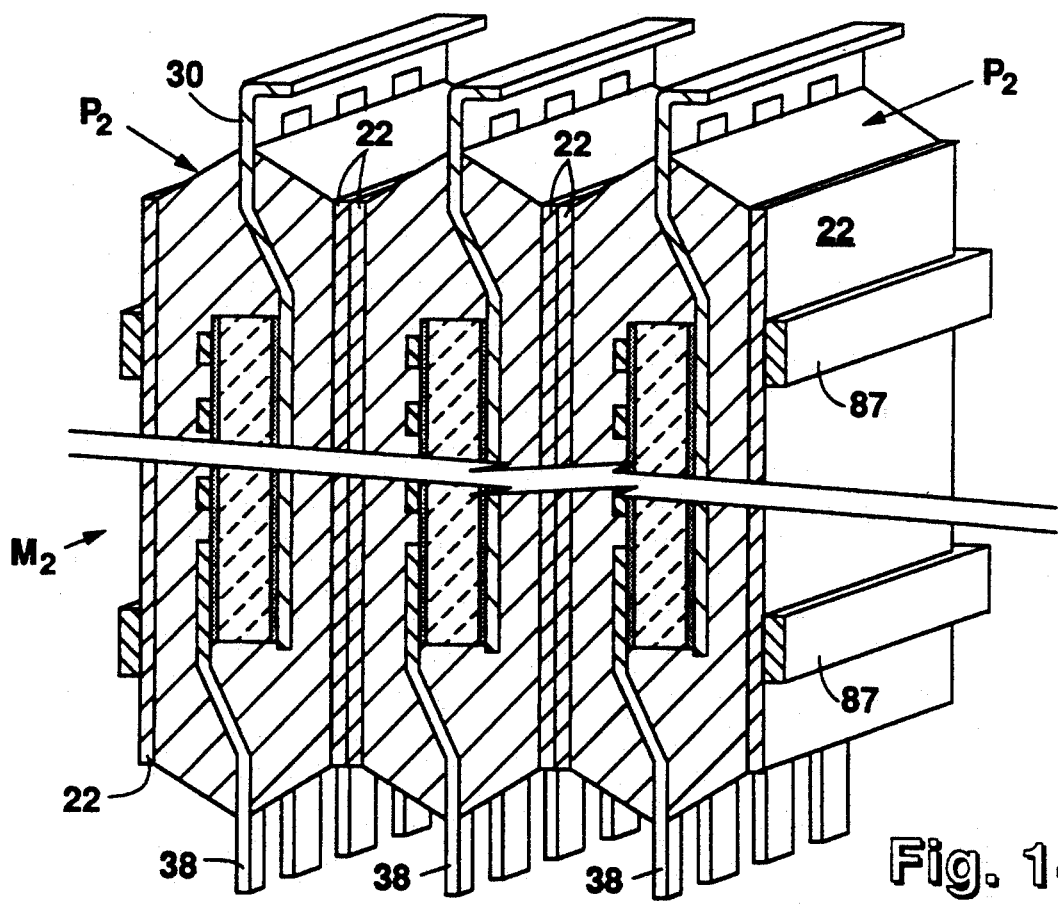
FIG. 14 illustrates an alternative embodiment of a portion of a modular or level-two package according to the present invention.

Alternatively, a plurality of level-one elements $P_2$ can be mechanically bound together rather than epoxy bonded. Referring now to FIG. 14, each element $P_2$ is provided with only exterior foil layers 22. The individual packages $P_2$ are mechanically bound together with any suitable means such as a tie 87 or a housing 82 as shown in FIGS. 12a or 15 surrounding the package $M_2$.

Figure 15:
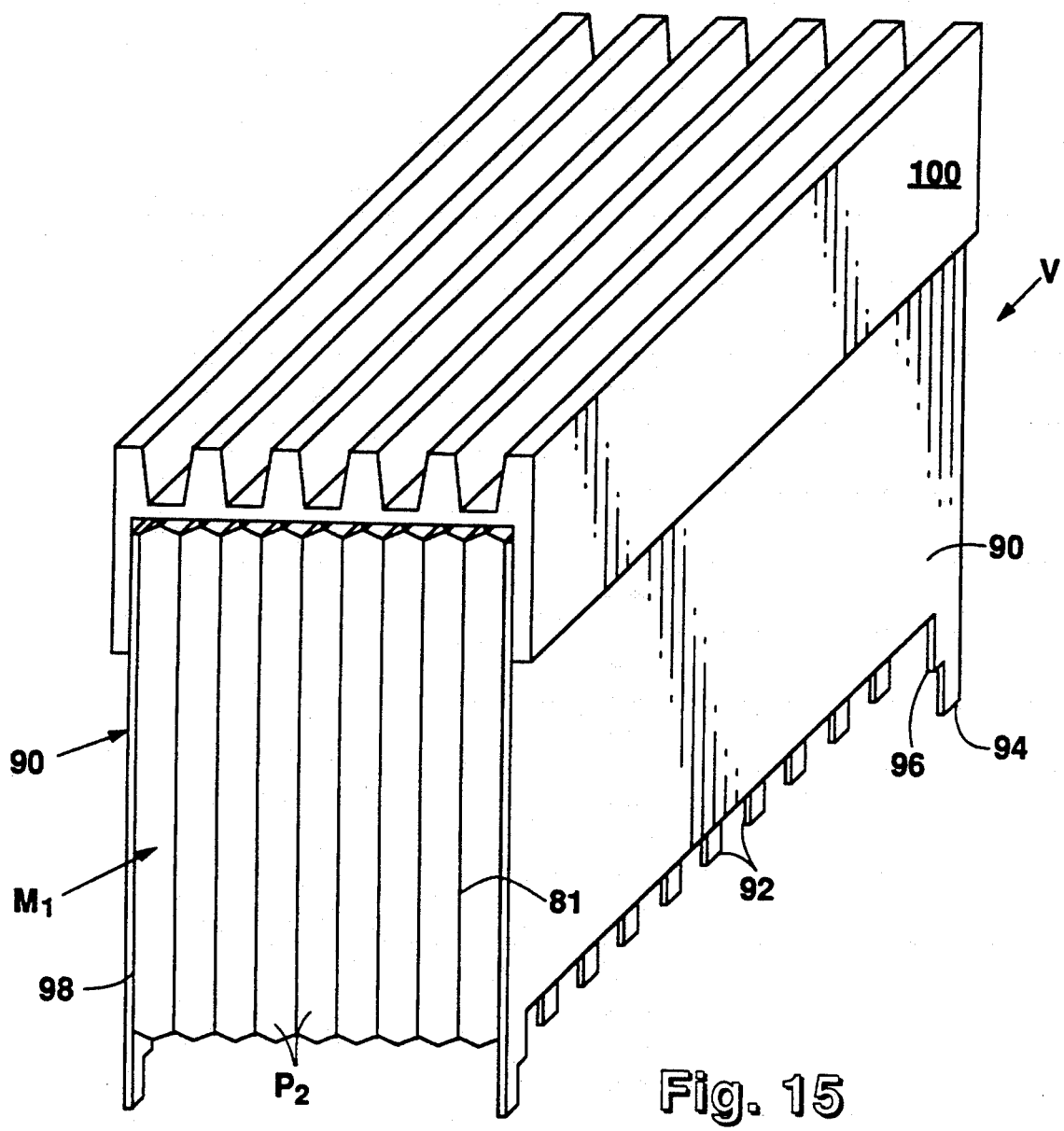
FIG. 15 illustrates a modular level-two vertically oriented package including a plurality of level-one packages and an external heat sink.

Assembled stacks $M_1$ or $M_2$ may be mounted in an exterior package V as illustrated in FIG. 15. Package V includes an exterior casing 90 which is a metal formed shield which may be in two pieces (Fig. 15) or may be a single piece traversing over the top of stack $M_1$ (numeral 82, FIG. 12a). Casing 90 is formed of sheet metal approximately six mils thick. Casing 90 also includes at each of the four corners of package V a printed circuit board mounting tab or locating pin 94 having an expanded portion midway on its length to form a height setting tab 96 to position package V above an underlying printed circuit board or header as described below.

In this embodiment, the individual level-one elements $P_2$ are either epoxy bonded together with a one mil thick epoxy layer 81 or mechanically bound together as previously described. Stack $M_1$ or $M_2$ may be adhered to casing 90 with an approximately one mil thick epoxy bond between outside surfaces of the stack $M_1$ or $M_2$ and interior surfaces of casing 90, or mechanically attached using any suitable clamping method.

Figure 15A:
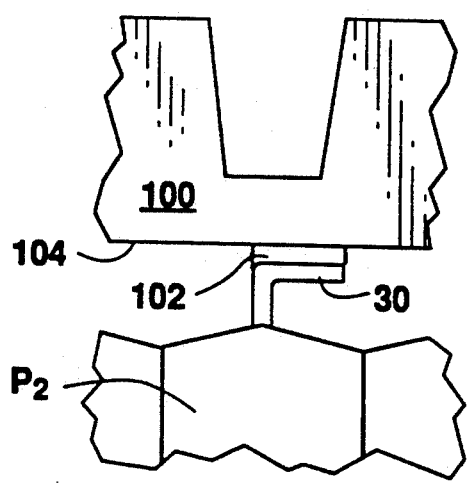
FIG. 15a illustrates assembly details of the package illustrated in FIG. 15.

Package V also includes a u-shaped heat sink element 100 formed of heat conductive material and shaped to fit snugly over the assembled stack $M_1$ and casing 90 so as to form an upper cap for package V. When affixed to package V heat sink 100 provides structural rigidity as well as heat transfer capability. Heat sink 100 is bonded to level-one heat sink elements 30 (Fig. 15a) via conductive epoxy bond 102. Prior to assembly, elements 30 of each element $P_2$ are uniformly bent to provide a relatively coplanar bonding surface for heat sink 100. The under surface 104 of heat sink 100 is coated with B-stage conductive epoxy and pushed onto the partially assembled package V so that surface 104 contacts each of the $P_2$ heat sink elements 30. Thereafter heat is applied to complete the bond 102.

Figure 16:
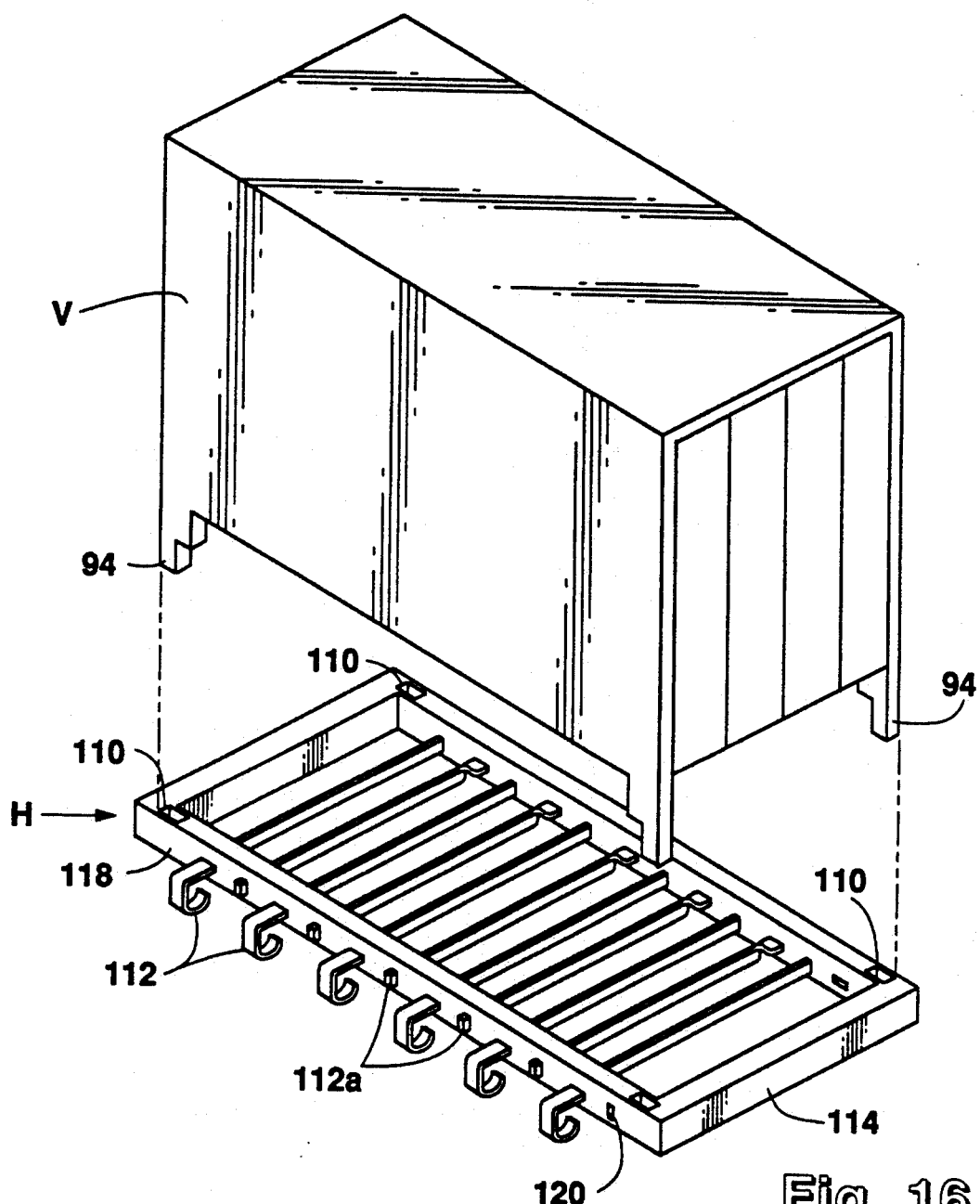
FIG. 16 illustrates an alternative method and apparatus for assembling a modular, vertically oriented level-two package to a printed circuit board.

Referring now to FIG. 16, the preferred method and apparatus for mounting package V to an underlying circuit board is illustrated. In this embodiment, package V is mounted to a preformed plastic non-conductive header H which is subsequently mounted to a printed circuit board to provide socket-type mounting. In this embodiment, package V is mounted to header H via mounting tabs 94 which fit into preformed holes 110 in header H.

Header H includes a rectangular frame 114 provided with a number of J-lead or gull-wing configured leads 112 which span the width of frame 114 and are uniformly spaced along two opposite sides of the perimeter of frame 114 consistent with industry standard spacing. Frame 114 is formed of high temperature plastic or transfer molding compound such as RYTON. Leads 112 extend from the perimeter of frame 114 as shown in detail in FIG. 16a. Leads 112 may be formed in conventional J-lead, gull-wing or other surface mount configuration as required. To provide dual-in-line lead configuration, alternating leads 112a (Fig. 16) are configured to have the J-lead or terminal portion 116 on the opposite side of frame 114 as leads 112, with the non-terminal ends being flush with the exterior surface 118 of frame 114.

Figure 16A:
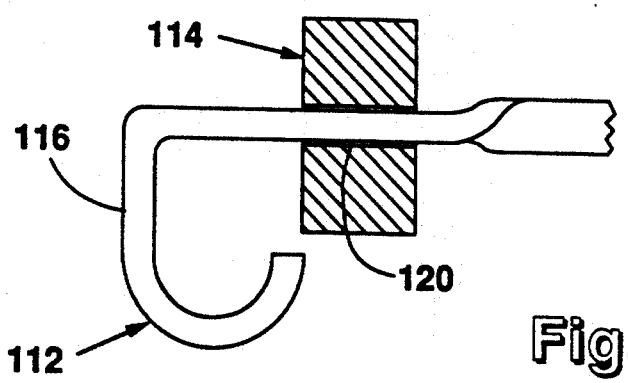
FIG. 16a illustrates assembly details for the package shown in FIG. 16.

Leads 112, 112a are formed of approximately five-mil copper having a rectangular cross-section. Leads 112, 112a are mounted in frame 114 through preformed rectangular slots 120. The portion of leads 112, 112a within slots 120 are horizontally configured, and the portion within the interior of frame 114 are rotated or twisted ninety degrees to be vertically oriented (Fig. 16a). To facilitate mounting package V, leads 112, 112a are plated or solder coated for subsequent attachment to individual leads 38 which are pre-treated with solder paste just prior to assembly.

In assembly, stack V is mounted to header H by insertion of tabs 94 into holes 110. Tabs 94 are then bent or glued to header H to temporarily hold stack V in place while leads 38 are soldered to leads 112, 112a. This configuration provides socket mounting and visible solder connections for serviceability.

HORIZONTAL LEVEL-TWO PACKAGING

Referring now to FIG. 17, the preferred embodiment of a horizontally oriented level-one package suitable for modular or level-two assembly is illustrated with a partial cut-out view of some interior details. The horizontal level-one package is preferred where overall height is a key consideration. In this embodiment, the level-one package P is constructed essentially as described above with reference to FIGS. 5 and 6 but may also include the integral heat sink element as shown in FIG. 8.

Package P is formed with a casing 12, optional epoxy layer 20 and aluminum foil layer 22 laminated above and below an integrated circuit die 14 (Figs. 5–6). The cut-out (FIG. 18) shows typical interior details of such a package wherein leads 16 and 18 extend laterally from package P, and are bent downward at an angle less than ninety degrees to provide spring-loading which facilitates mounting as described below. Leads 16 and 18 are formed of copper approximately one and four-tenths to two and eight-tenths mils thick in a substantially rectangular cross-section and with adequate temper to provide a relatively flat, flexible connector. Leads 16 and 18 are bonded over die 14 with a two-mil semiconductor grade adhesive dielectric 130 using conventional automated tape bonding or low-profile ribbon or wire bonding techniques to a copper lead frame 131 to bond the leads to bonding pads 132 at the perimeter of die 14. Leads 16, 18 are extended from package P and bent at their distal ends to provide flexibility for stress relief in mounting as described above. To facilitate stacking, each package P is formed having a nesting slot or detent 136 at each of four corners, such slots 136 being formed to receive a complimentary shaped nesting tab 138 formed at the lower surface at each of the four corners.

The individual level-one packages P are assembled in a horizontally oriented level-two package T in the manner illustrated in FIG. 18. Each package P is individually assembled and tested prior to assembly in horizontal stack package T. Package T is built upon a hard-anodized aluminum base 142 which alternatively can be formed of molded RYTON, or other suitable electrically insulating material. While FIG. 18 illustrates an assembly of four level-one packages for clarity, it should be noted that the typical package T would include eight or nine level-one packages. Furthermore, while some of the drawings illustrate a package P having only four leads 16, 18 per side for clarity, a typical package P would include many more (typically 28), depending upon the pin-out requirements of the particular integrated circuit being packaged.

Level-one packages P for assembly into multiple-unit level-two packages T are formed as described above. Each unit P includes a die 14, a case 12 a metallic foil lamination 22 and may include epoxy lamination layer 20 (Figs. 5, 6). In those embodiments where each element P only includes an aluminum or copper foil lamination 22 (Fig. 6), the individual packages P are simply mechanically bound together by the structural members of package T (Fig. 18). Alternatively, each level-one package P can be adhered to the package P immediately above and below with a one-mil thick epoxy adhesive 148, and only upper and lower level-one packages $P_{10}$ and $P_{11}$ are provided with a metal foil lamination 146 over an adhesive layer 148 at the upper and lower surfaces of $P_{10}$ and $P_{11}$, respectively. In this embodiment, each of leads 16, 18 (Fig. 17) is formed of copper to provide spring-like resiliency, and extended from package P to allow stress relief.

Referring now to FIG. 18, package T includes base 142, level-one packages P stacked above base 142, electrically and thermally conductive external rails 150 electrically and thermally coupled to leads 16 and 18, and a cap member 160. Cap member 160 and base member 142 must be electrically isolated from rails 150 and preferably should be formed of thermally conductive material. In addition to non-conducting plastics such as RYTON, cap 160 and base 142 can be formed of heat conductive materials such as plastic coated aluminum or preferably hard-anodized aluminum without coating.

Cap 160 includes a plurality of slots 161 formed to be aligned with upper portions 162 of rails 150. Once the stack of packages P are assembled, cap 160 is adhered to the upper surface of package $P_{10}$, with upper portions 162 of rails 150 extending through slots 161 and being bent over to clamp rails 150 to cap 160.

Figure 19A:
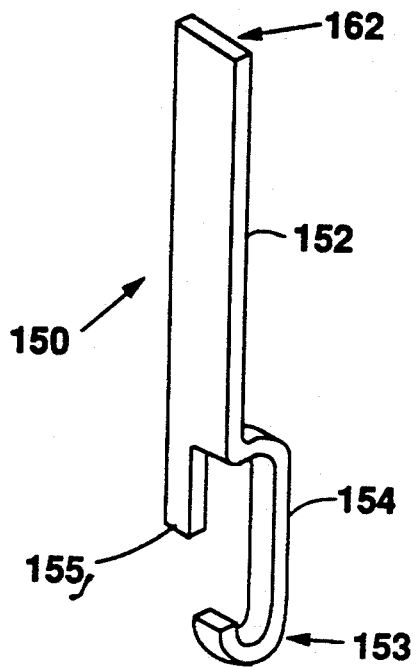
FIGS. 19a, b, c and d are isometric views of alternative embodiments of conductive rails used in horizontally oriented embodiments illustrated in FIG. 18.
Figure 19B:
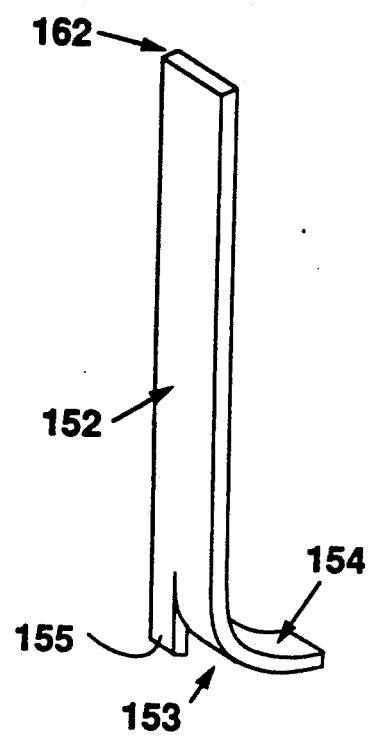
Figure 19C:
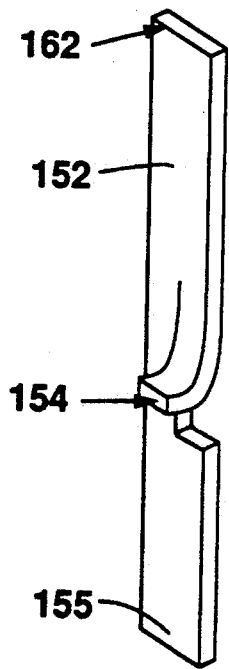
Figure 19D:
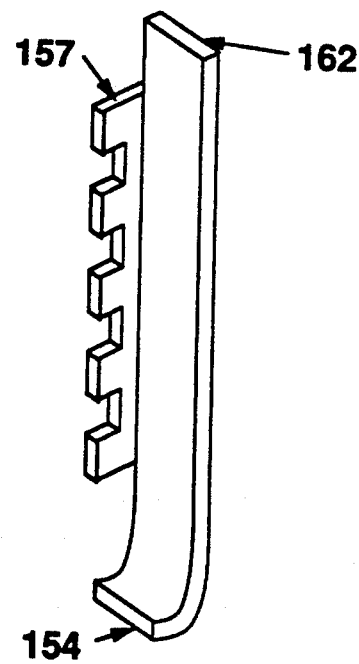

Rails 150 include a lower portion 152 (Fig. 19) which further includes base mounting tab 155 and a circuit board mounting portion 154 configured in either J-lead or gull-wing configuration (FIGS. 19a, b). Additionally, rails 150 can include an integral heat sink flange 157 (FIG. 19d) for improved heat dissipation.

Assembly of level-two package T can be in one of two formats. In the first format, all of the required level-one packages P are horizontally stacked above base 142 and adhered or bound to one another first, and thereafter assembly continues with the provision of a plurality of vertically oriented lead rail elements 150. Rail elements 150 are formed of conductive resilient material such as 110 alloy copper having a cross-sectional thickness in the range of four to eight-mils. Each rail element (FIG. 19) comprises an intermediate lead contact portion 152 and a lower J-lead, butt-lead or gull-wing configured SMT contact portion 154.

Alternatively, in the preferred embodiment, assembly and testing are conducted level by level, with each level-one package P being assembled, tested, mounted on the stack, with leads 16, 18 soldered to the corresponding rails 150, and re-tested before a subsequent level-one package P is added to the stack. This methodology insures that all level-one elements are functional before subsequent elements are added to the stack to avoid waste.

Where the level-one packages are to be mounted in the stack without adhesive bonding between level-one elements, the following procedure is utilized:

1. Assemble (including integrated circuit burn-in) and fully test a plurality of level-one packages, sorting level-one packages by speed or signal response time to ensure speed uniformity in level-two modules;
2. Preassemble the module header and rails;
3. Designate selected level-one packages for assembly into a particular module by level in the stack, cutting off unused leads for each respective level-one package;
4. Place the lowest level-one package in position on the header, solder the leads 16, 18 in place to the rails 150, using a laser or a hot bar to solder leads simultaneously;
5. Test the assembly for satisfactory electrical performance; remove and replace bad level-one package;
6. Repeat steps 4 and 5 for the remaining level-one packages for the module;
7. Mount the upper cap 160, and secure the connection between cap 160 and rails 150; and
8. Electrically test the entire assembled module.

Where adhesive bonding between level-one packages is to be used, the following procedure is utilized:

1. Assemble (including integrated circuit burn-in) and fully test a plurality of level-one packages, sorting level-one packages by speed or signal response time to ensure speed uniformity in level-two modules;
2. Preassemble the module header and rails;
3. Designate selected level-one packages for assembly into a particular module by level in the stack, cutting off unused leads for each respective level-one package;
4. Place the lowest level-one package in position on the header, solder the leads 16, 18 in place to the rails 150, using a laser or a hot bar to solder leads simultaneously;
5. Test the assembly for satisfactory electrical performance; remove and replace bad level-one package;
6. Place a B-stage epoxy lamination over the upper surface of the lowest level-one package previously mounted in the header;
7. Place a temporary teflon spacing lamination (2 mils thick) over the adhesive, B-stage epoxy lamination;
8. Mount the next level-one package over the teflon spacer and bond leads 16, 18 to rails 150;
9. Test the assembly for electrical performance;
10. Remove the teflon spacer if performance is satisfactory;
11. Heat laminate the adhesive bond between level-one packages to an intermediate bonding stage;
12. Repeat steps 6–10 until all level-one packages for the module are assembled;
13. Install a cap 160 over upper level-one package and secure to rails 150;
14. Complete the cure of the bonding adhesive between layers;
15. Test the entire module for electrical performance.

In either case, once the stack of level-one packages is completed and all leads 16, 18 have been solder connected to rails 150, a cap 160 formed of high temperature material, such as anodized aluminum, is mounted to the upper surface of the topmost level-one package $P_{10}$. Cap 160 is formed having a plurality of slots 161 to receive the upper ends 162 (FIG. 19a) of rails 150.

After cap 160 is affixed, heat sinks may be attached to the package T in one of several alternative embodiments. In a first embodiment (FIG. 18a), heat sink elements 170 are mounted to the exterior surface of portions 152 of rails 150 by means providing for electrical insulation but thermal conductance. One method is to bond heat sinks 170 to rails 150 using a two-mil thick high temperature epoxy adhesive. Alternatively, a two-mil thick beryllium oxide pad can be interposed between heat sinks 170 and rails 150 and adhered to sinks 170 and rails 150 with a suitable high temperature adhesive. Such heat sinks are preferably formed of anodized aluminum. Alternatively, heat is dissipated via the rails 150 without additional external heat sinks, or via integral heat sink flanges providing increased surface area for rails 150 such as the embodiment shown in FIG. 19d.

Where the stack is assembled without adhesive bonding (either horizontally or vertically) between the level-one elements and the elements are subsequently soldered to the rails simultaneously in one reflow process the following procedure is utilized:

1. Assemble (including integrated circuit burn-in) and fully test a plurality of level-one packages, sorting level-one packages by speed or signal response time to ensure speed uniformity in level-two modules;
2. Preassemble the module header and rails;
3. Designate selected level-one packages for assembly into a particular module by level in the stack, cutting off unused leads for each respective level-one package;
4. Place solder paste on all level-one leads;
5. Place the header assembly into a temporary fixture and assemble all level-one packages into the rail/header assembly;
6. Attach the top cap and remove the assembly from the fixture;
7. Reflow solder all the level-one leads to the header rails in one reflow process;
8. Test entire stack;
9. If defective, remove the cap, desolder and remove the level-one package from the header assembly, replace the defective unit(s) and rework the assembly (stages 1 and 8).

With the foregoing assembly complete, heat is conducted from the level-one packages P via leads 16, 18 to rails 150 and thereafter dissipated in heat sinks 170. If a horizontal level-one package with integral heat sink elements 30 is employed (Fig. 8), an additional set of rails 150 on a third side of package T are soldered to elements 30 in the same manner as described above, and an additional heat sink 170 can be attached.

Figure 20:
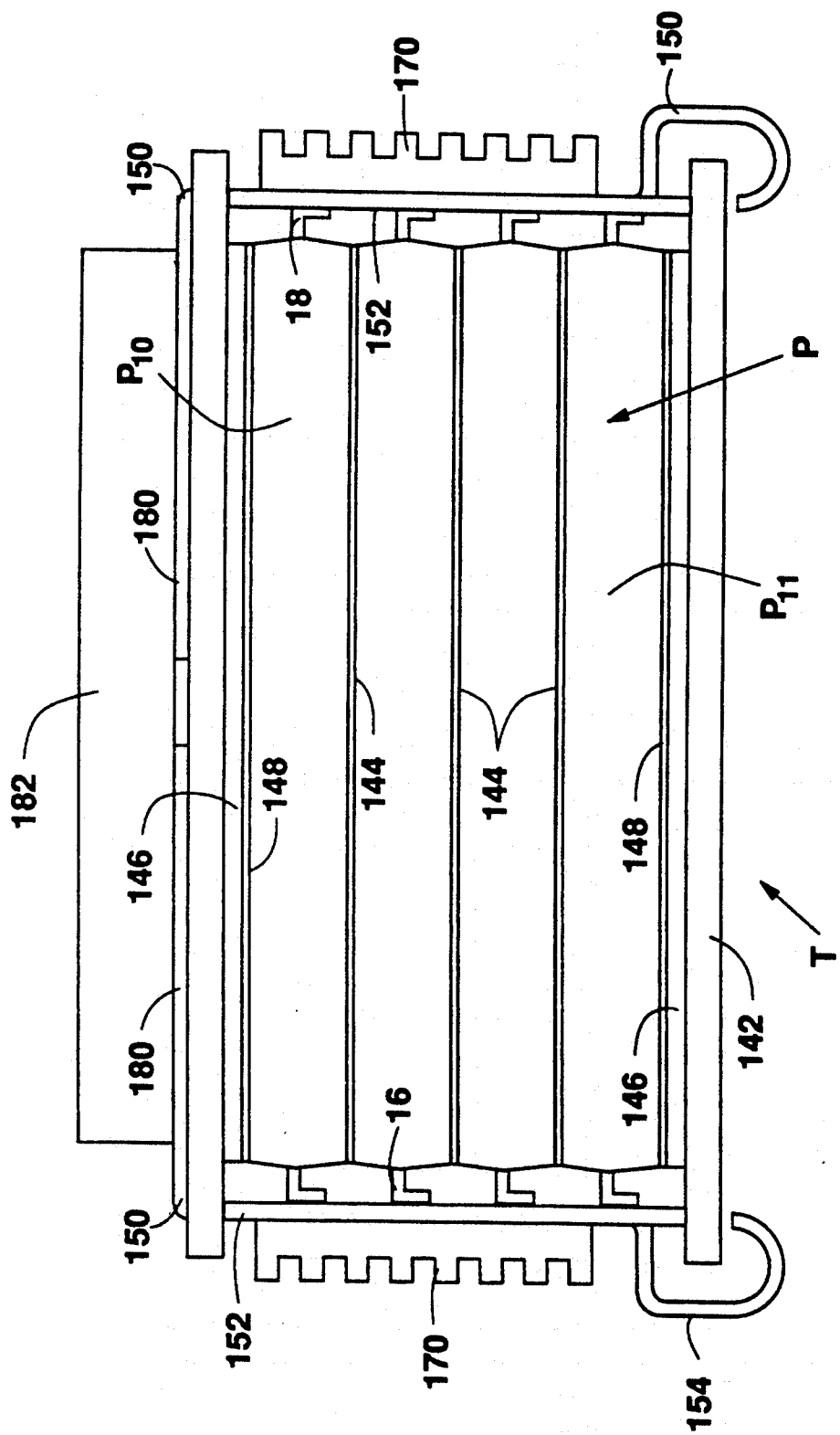
FIG. 20 illustrates an alternative embodiment of a horizontally oriented modular or level-two package according to the present invention.

An alternative embodiment of package T is disclosed in FIG. 20. In this embodiment, each of rails 150 are formed including an upper, horizontally oriented extension 180 which extends through cap 160 and traverses slightly less than half way across the width of cap 160 so as to be in surface contact with the upper surface of cap 160. An additional heat sink 182 is affixed to extensions 180 of rails 150 using a heat conductive adhesive. In this manner, heat from level-one packages P is conducted through leads 16 and 18 to rails 150 and dissipated in heat sinks 170 and 182.

A major advantage of the invention is in the resulting efficiency and flexibility for thermal management of the module. At a fifty percent duty cycle a nine-high module (four magabytes by one by nine) needs to dissipate up to 2.5 watts and a $\theta JC$ of less than 20° C./watt is desirable. The various embodiments of the level-one packages of the present invention provide an extremely efficient 2° C. to 5° C./watt $\theta JC$, and the modular package may be designed to provide a 15° C. to 20° C./watt $\theta JC$. This design thus permits the utilization of conventional air-cooling convection and conduction through the leads 16, 18 to rails 150 and heat sinks or a combination of these methods, as distinguished from more complicated and expensive cooling techniques.

Figure 21:
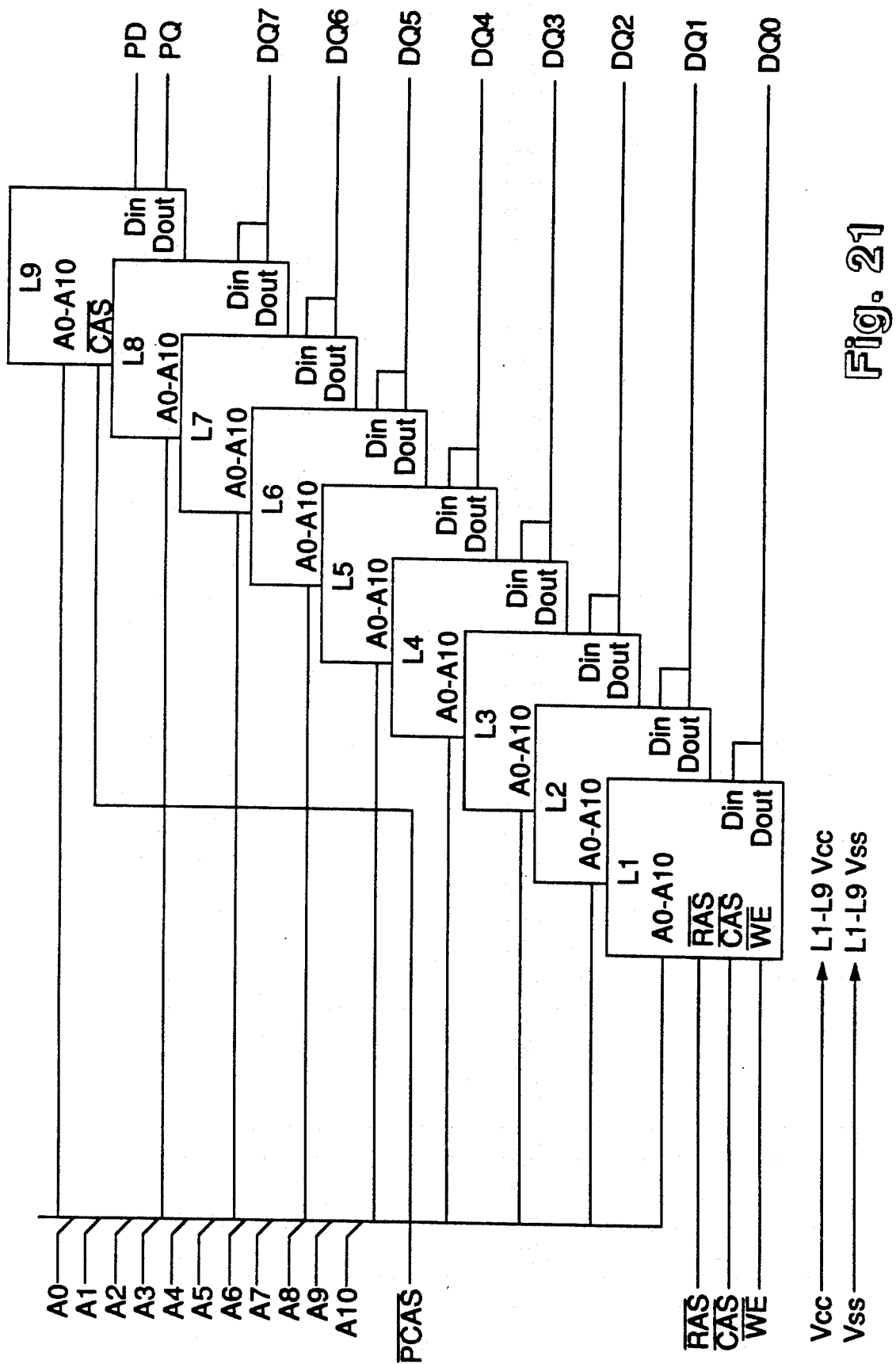
FIG. 21 is a schematic illustration of one method for electrical signal busing of the level-one packages in a modular, level-two package according to the present invention.

The level-two modular construction is especially useful to provide a multiple element memory array. An example of this array would be a four megabyte by one by nine array to form a four megabyte deep, 9-bit wide DRAM module. This module would be a single package replacement for a four megabyte by nine SIMM card. Each individual element P of the module will have twenty-eight leads where only eighteen of the twenty-eight leads require connection to the bus rails 150. The leads not requiring a connection for each element P are severed from the device flush to the package P. The tape lead frame, which provides the internal, level-one die to lead connections, provides for a common data-in, data-out bus. This bus will connect to eight pins on the package. Only one of the eight pins will be used for each level of the total module, with the other seven leads severed. This provides a common lead frame which could be used by the eight memory layers providing the data bits for the memory module. The parity bit memory layer requires a separate lead frame. The data-in and data-out pin are separated and the CAS input signal must be separated from the common CAS bus of the eight memory bits. A schematic illustrating an example of the manner of electrical interconnection is provided in FIG. 21.

Other options are available for various configurations. Static rams could be packaged in a four high module to provide either a four, sixteen, or thirty-two bit wide array. DRAMS could also be packaged in four or five high stacks to accommodate those areas where product height is a concern. The five-high stack could be settled as a standard height, with a common header for the stack. For the four-high stack a "dummy" spacer layer will be added to maintain the product standard size.

Figure 22:
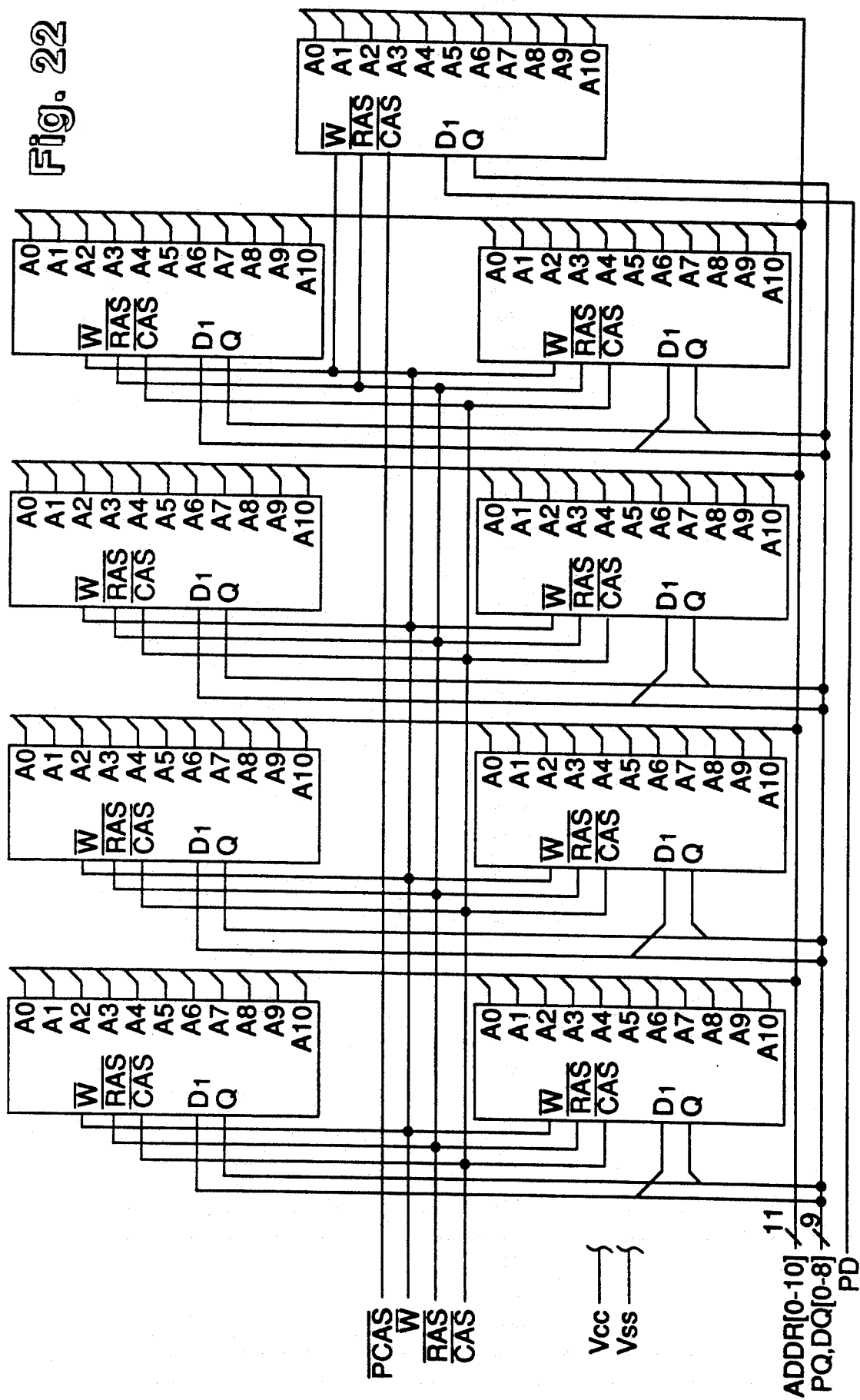
FIG. 22 is a schematic illustration of electrical signal busing for a four megabyte by one by nine element DRAM module.
Figure 22:
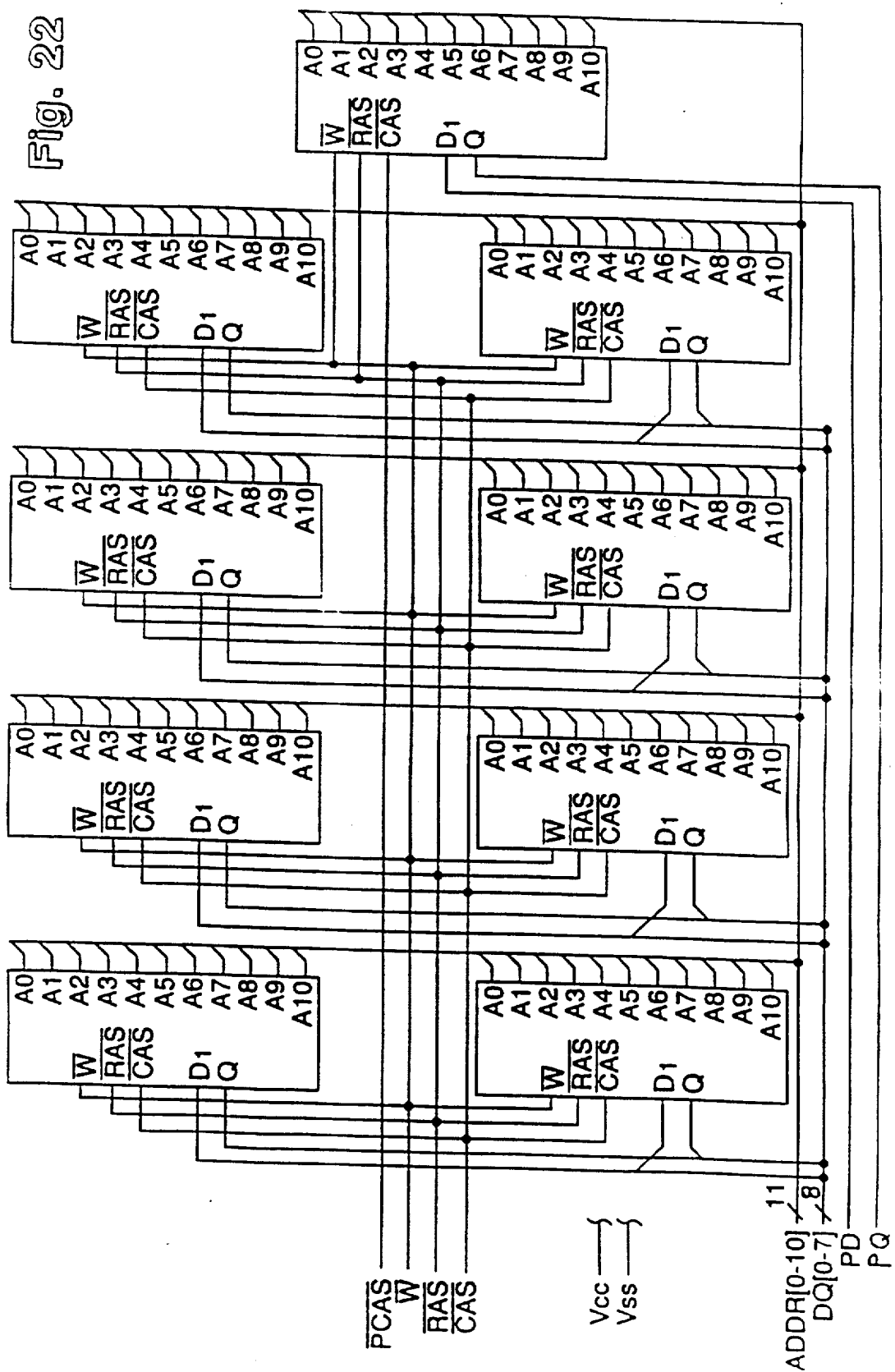

Total pin count of the modules determines the lead spacing, stack height, and bus widths. Those modules with lead counts below thirty pins could be assembled with standard 50-mil lead spacing. Larger lead count devices will be set on 25-mil centers. The stack height and bus widths (data and address buses) are indirectly related. Higher stacks naturally make the data buses wider and provide for larger pin counts. FIG. 22 provides an exemplary four megabyte by one by nine DRAM configuration. The following table represents examples of configurations, pin counts, data widths and product types:

| Product | Chip | Total Memory | Configuration | Pin Count | Output Word Length |
|---|---|---|---|---|---|
| DRAM | 1 Meg | 9M Bit | 1M × 1 × 9 | 26 | 8 B, +1 Par. |
| DRAM | 1 Meg | 9M Bit | 256K × 4 × 9 | 52 | 32 B, +4 Par. |
| DRAM | 4 Meg | 36M Bit | 1M × 4 × 9 | 53 | 32 B, +4 Par. |
| DRAM | 4 Meg | 36M Bit | 4M × 1 × 9 | 28 | 8 B, +1 Par. |
| SRAM | 256K | 2M Bit | 256K × 1 × 8 | 30 | 8 B |
| SRAM | 256K | 1M Bit | 256K × 1 × 4 | 26 | 4 B |
| SRAM | 256K | 2M Bit | 64K × 4 × 8 | 52 | 32 B |
| SRAM | 256K | 1M Bit | 64K × 4 × 8 | 36 | 16 B |
| SRAM | 1 Meg | 8M Bit | 256K × 4 × 8 | 55 | 32 B |
| SRAM | 1 Meg | 4M Bit | 256K × 4 × 4 | 39 | 16 B |

For those (× 1) memory chips with separate Din, Dout lines, the Din and Dout lines are tied together. The parity Din and Dout are not tied together.

The foregoing description provides details of preferred embodiments of an ultra-thin level-one integrated circuit package and a method of assembling level-one packages into a high density level-two package. The laminated structure of the level-one packages provides moisture protection and structural resistance to flexing to enable an ultra-thin package to be constructed without loss of circuit integrity. The level-two package provides high density and thermal and environmental control in an easily manufactured package.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of manufacturing a multiple element integrated circuit modular package comprising the steps of:
    (a) providing a plurality of level-one integrated circuit packages of the type including
        an integrated circuit element formed in a silicon substrate, and
        a transfer molded plastic casing surrounding said integrated circuit element, said casing having an upper surface, a lower surface and a perimeter wall; and
        wherein said integrated circuit element includes a plurality of electrical interconnect leads extending from said silicon substrate through a portion of said perimeter wall of said casing;
    (b) assembling a module header including a plurality of electrically conductive rails adapted for electrical connection to said leads extending from said level-one packages;
    (c) mounting a first level-one package in said header;
    (d) electrically connecting said leads of said first level-one package to said rails;
    (e) repeating steps (c) and (d) for second and subsequent level-one packages;
    (f) mounting an upper cap member above the last level-one package and securing said cap to said header; and
    (g) electrically testing the completed modular package.

2. The method of claim 1, further comprising the step of electrically testing each level-one package as they are assembled in said module before assembling the next level-one package.

3. The method of claim 2, wherein said step of electrically testing each assembled level-one package includes the step of replacing any defective level-one packages.

4. The method of claim 1, wherein said step of assembling said level-one packages includes the step of electrically testing each assembled package.

5. The method of claim 4, wherein said step of assembling said level-one packages further includes the step of sorting said level-one packages based upon electrical signal response time.

6. The method of claim 4, wherein said step of electrically testing each assembled level-one package includes the step of replacing any defective level-one packages.

7. The method of claim 1, wherein each of said plurality of level-one integrated circuit packages comprises:
   (1) an integrated circuit element formed in a silicon substrate;
   (2) an encapsulating casing surrounding said integrated circuit element, said encapsulation casing having an upper surface, a lower surface and a perimeter wall;
   (3) a first metal foil lamination applied over said upper surface of said casing;
   (4) a second metal foil lamination applied over said lower surface of said casing; and wherein said integrated circuit element includes a plurality of electrical interconnect leads extending from said silicon substrate through a portion of said perimeter wall of said casing.

8. The method of claim 7, wherein said encapsulating casing is formed of transfer molded plastic.

9. A method of manufacturing a multiple-element integrated circuit modular package comprising the steps of:
   (a) providing a plurality of level-one integrated circuit packages of the type including
     an integrated circuit element formed in a silicon substrate, and
     a transfer molded plastic casing surrounding said integrated circuit element, said casing having an upper surface, a lower surface and a perimeter wall; and
     wherein said integrated circuit element includes a plurality of electrical interconnect leads extending from said silicon substrate through a portion of said perimeter wall of said casing;
   (b) assembling a module header including a plurality of electrically conductive rails adapted for electrical connection to said leads extending from said level-one packages;
   (c) building a stack of level-one packages comprised of a first level-one package and subsequent level-one packages, beginning by mounting a first level-one package in said header;
   (d) electrically connecting said leads of said first level-one package to said rails;
   (e) placing a preformed adhesive lamination over the upper surface of said first level-one package;
   (f) placing a spacing lamination over said adhesive lamination;
   (g) mounting a subsequent level-one package in said header assembly over said spacing lamination;
   (h) electrically connecting said leads from said subsequent level-one package to said rails;
   (i) testing the assembly for electrical performance;
   (j) removing the spacing lamination if the performance is satisfactory;
   (k) bonding the adhesive lamination between said level-one packages;
   (l) completing the assembly by repeating the steps (e) through (k) until all subsequent level-one packages are mounted, tested and bonded;
   (m) mounting an upper cap member over the last level-one package and securing said cap to said header assembly; and
   (n) electrically testing the assembled modular package.

10. The method of claim 9, wherein said adhesive lamination is formed of a high-temperature moisture resistant B-stage epoxy.

11. The method of claim 9, wherein said spacing lamination is formed of teflon.

12. The method of claim 9, further comprising the step of electrically testing the performance of the module after each level-one package is assembled in the module.

13. The method of claim 9, wherein said step of assembling said level-one packages further includes the step of sorting said level-one packages based upon electrical signal response time.

14. The method of claim 9, wherein said step of testing the assembly for electrical performance includes the step of replacing any defective level-one packages.

15. The method of claim 9, wherein the cap is formed of high temperature material.

16. The method of claim 15, wherein the high temperature material is anodized aluminum.

17. The method of claim 9, wherein the cap has a plurality of slots to receive said header.

18. The method of claim 9, wherein each of said plurality of level-one integrated circuit packages comprises:
   (1) an integrated circuit element formed in a silicon substrate;
   (2) an encapsulating casing surrounding said integrated circuit element, said encapsulation casing having an upper surface, a lower surface and a perimeter wall;
   (3) a first metal foil lamination applied over said upper surface of said casing;
   (4) a second metal foil lamination applied over said lower surface of said casing; and wherein said integrated circuit element includes a plurality of electrical interconnect leads extending from said silicon substrate through a portion of said perimeter wall of said casing.

19. A method of manufacturing a multiple-element integrated circuit package comprising the steps of:
   (a) assembling a plurality of level-one integrated circuit packages each including a plurality of electrical leads for connection to internal integrated circuitry;
   (b) preassembling a module header, including a plurality of conductive rails adapted for electrical and thermal coupling to said leads;
   (c) designating particular leads for each level-one package to be connected to particular rails;
   (d) preparing the designated leads for electrical connection to the designated rails;
   (e) assembling level-one packages into the header and rail assembly, with designated leads positioned for connection to designated rails; and
   (f) electrically connecting all the designated leads to the designated rails.

20. The method of claim 19, further including the step of:
   (g) electrically testing the performance of the assembled modular package.

21. The method of claim 20, further including the step of:
   (h) replacing defective level-one packages and reassembling the modular package.

22. The method of claim 19, further comprising the step of mounting a module cap member above the uppermost level-one package.

23. The method of claim 19, wherein said step of electrically connecting all the designated leads to the designated rails is performed simultaneously.

24. The method of claim 19, wherein said step of assembling said level-one packages further includes the step of sorting said level-one packages based upon electrical signal response time.

* * * * *

UNITED STATES PATENT AND TRADEMARK OFFICE
CERTIFICATE OF CORRECTION

PATENT NO. : 5,279,029
DATED : January 18, 1994
INVENTOR(S) : Carmen D. Burns

It is certified that error appears in the above-indentified patent and that said Letters Patent is hereby corrected as shown below:

The following corrections are made to Figure 22.

Control input "PQDQ[0-8]" is changed to -- DQ[0-7] --.

The connection between the Q input to the RAM which connects to the PCAS input control line and control input DQ[0-7] has been eliminated.

Newly added control input PQ has been connected to the Q input of the RAM which connects to the PCAS input control line.

The bit number indicator on the DQ[0-7] input line has been changed from "9" to -- 8 --.

Figure 22 should appear as per attached sheet.

Signed and Sealed this

Twenty-fifth Day of April, 1995

*Attest:*

BRUCE LEHMAN

*Attesting Officer*         *Commissioner of Patents and Trademarks*

UNITED STATES PATENT AND TRADEMARK OFFICE
CERTIFICATE OF CORRECTION

PATENT NO. : 5,279,029
DATED : January 18, 1994
INVENTOR(S) : Burns

It is certified that error appears in the above-indentified patent and that said Letters Patent is hereby corrected as shown below:

Column 14, line 61:
    Claim 3 should depend from claim 4, not from claim 2.
Column 15, line 6:
    Claim 7 should depend from claim 9, not from claim 1.
Column 15, line 22:
    Claim 8 should depend from claim 18, not from claim 7.

Signed and Sealed this

Thirtieth Day of April, 1996

Attest:

BRUCE LEHMAN

*Attesting Officer*      *Commissioner of Patents and Trademarks*